(12) United States Patent
Munch et al.

(10) Patent No.: US 7,616,444 B2
(45) Date of Patent: Nov. 10, 2009

(54) GIMBALLED ATTACHMENT FOR MULTIPLE HEAT EXCHANGERS

(75) Inventors: Mark Munch, Los Altos Hills, CA (US); Douglas E. Werner, Santa Clara, CA (US)

(73) Assignee: Cooligy Inc., Mountain View, CA (US)

( * ) Notice: Subject to any disclaimer, the term of this patent is extended or adjusted under 35 U.S.C. 154(b) by 0 days.

(21) Appl. No.: 11/800,101

(22) Filed: May 3, 2007

(65) Prior Publication Data

US 2007/0211431 A1 Sep. 13, 2007

Related U.S. Application Data

(63) Continuation-in-part of application No. 10/945,807, filed on Sep. 20, 2004, now Pat. No. 7,301,773.

(60) Provisional application No. 60/577,262, filed on Jun. 4, 2004, provisional application No. 60/797,955, filed on May 4, 2006.

(51) Int. Cl.
*H05K 7/20* (2006.01)
*F28F 7/00* (2006.01)
*H01L 23/34* (2006.01)

(52) U.S. Cl. .................... 361/719; 165/80.2; 165/80.3; 165/80.4; 165/104.33; 257/718; 257/719; 361/699; 361/700; 361/701; 361/702; 361/703

(58) Field of Classification Search .................. 361/719
See application file for complete search history.

(56) References Cited

U.S. PATENT DOCUMENTS

| | | | |
|---|---|---|---|
| 596,062 A | 12/1897 | Firey | |
| 2,039,593 A | 5/1936 | Hubbuch et al. | 257/256 |
| 2,273,505 A | 2/1942 | Florian | 138/28 |
| 3,361,195 A | 1/1968 | Meyerhoff et al. | 165/80 |
| 3,654,988 A | 4/1972 | Clayton, III | 165/17 |
| 3,771,219 A | 11/1973 | Tuzi et al. | 29/583 |
| 3,817,321 A | 6/1974 | Von Cube et al. | 165/105 |
| 3,823,572 A | 7/1974 | Cochran, Jr. | 62/160 |
| 3,852,806 A | 12/1974 | Corman et al. | 357/82 |
| 3,929,154 A | 12/1975 | Goodwin | 137/344 |
| 3,946,276 A | 3/1976 | Braun et al. | 317/100 |
| 3,948,316 A | 4/1976 | Souriau | 165/105 |

(Continued)

FOREIGN PATENT DOCUMENTS

EP 1 520 993 A2 6/2005

(Continued)

*Primary Examiner*—Gregory D Thompson
(74) *Attorney, Agent, or Firm*—Haverstock & Owens LLP

(57) ABSTRACT

One or more heat exchangers are coupled to one or more heat sources using a single gimballed joining mechanism. The joining mechanism includes a gimbal plate and a gimbal joint. The gimbal joint enables independent application of a retention force to the heat exchanger as a single-point load. This results in a balanced and centered application of the retaining force over the thermal interface area. The gimbal plate is mounted directly to a circuit board using spring means. The spring means regulate the amount of retention force directed through the gimbal joint to each heat exchanger. Because the gimbal joint is rotation-compliant, the two mating faces making up the thermal interface are forced into a parallel mate. In this manner, a high performance TIM interface is generated.

62 Claims, 12 Drawing Sheets

U.S. PATENT DOCUMENTS

| | | | |
|---|---|---|---|
| 4,109,707 A | 8/1978 | Wilson et al. | 165/46 |
| 4,138,996 A | 2/1979 | Cartland | 126/271 |
| 4,194,559 A | 3/1980 | Eastman | 165/105 |
| 4,203,488 A | 5/1980 | Johnson et al. | 165/80 B |
| 4,211,208 A | 7/1980 | Lindner | 126/400 |
| 4,235,285 A | 11/1980 | Johnson et al. | 165/80 B |
| 4,248,295 A | 2/1981 | Ernst et al. | 165/105 |
| 4,312,012 A | 1/1982 | Frieser et al. | 357/82 |
| 4,332,291 A | 6/1982 | Mulock-Bentley | 165/76 |
| 4,345,267 A | 8/1982 | Corman et al. | 357/81 |
| 4,450,472 A | 5/1984 | Tuckerman et al. | 357/82 |
| 4,467,861 A | 8/1984 | Kiseev et al. | 165/104.22 |
| 4,485,429 A | 11/1984 | Mittal | 361/386 |
| 4,494,171 A | 1/1985 | Bland et al. | 361/386 |
| 4,516,632 A | 5/1985 | Swift et al. | 165/167 |
| 4,540,115 A | 9/1985 | Hawrylo | 228/123 |
| 4,561,040 A | 12/1985 | Eastman et al. | 361/385 |
| 4,567,505 A | 1/1986 | Pease et al. | 357/81 |
| 4,573,067 A | 2/1986 | Tuckerman et al. | 357/82 |
| 4,574,876 A | 3/1986 | Aid | 165/46 |
| 4,644,385 A | 2/1987 | Nakanishi et al. | 357/82 |
| 4,664,181 A | 5/1987 | Sumberg | 165/104.13 |
| 4,675,783 A | 6/1987 | Murase | 361/385 |
| 4,716,494 A | 12/1987 | Bright et al. | 361/386 |
| 4,758,926 A | 7/1988 | Herrell et al. | 361/385 |
| 4,791,983 A * | 12/1988 | Nicol et al. | 165/80.4 |
| 4,793,405 A | 12/1988 | Diggelmann et al. | 165/104.33 |
| 4,866,570 A | 9/1989 | Porter | 361/382 |
| 4,868,712 A | 9/1989 | Woodman | 361/388 |
| 4,893,174 A | 1/1990 | Yamada et al. | 357/82 |
| 4,894,709 A | 1/1990 | Phillips et al. | 357/82 |
| 4,896,719 A | 1/1990 | O'Neill et al. | 165/170 |
| 4,908,112 A | 3/1990 | Pace | 204/299 R |
| 4,938,280 A | 7/1990 | Clark | 165/80.4 |
| 4,978,638 A | 12/1990 | Buller et al. | 437/209 |
| 5,009,760 A | 4/1991 | Zare et al. | 204/183.3 |
| 5,016,090 A | 5/1991 | Galyon et al. | 357/82 |
| 5,016,138 A | 5/1991 | Woodman | 361/381 |
| 5,043,797 A | 8/1991 | Lopes | 357/82 |
| 5,057,908 A | 10/1991 | Weber | 357/81 |
| 5,058,627 A | 10/1991 | Brannen | 138/27 |
| 5,070,040 A | 12/1991 | Pankove | 437/209 |
| 5,083,194 A | 1/1992 | Bartilson | 357/81 |
| 5,088,005 A | 2/1992 | Ciaccio | 361/385 |
| 5,099,311 A | 3/1992 | Bonde et al. | 357/82 |
| 5,099,910 A | 3/1992 | Walpole et al. | 165/80.4 |
| 5,105,430 A | 4/1992 | Mundinger et al. | 372/35 |
| 5,125,451 A | 6/1992 | Matthews | 165/80.4 |
| 5,131,233 A | 7/1992 | Cray et al. | 62/64 |
| 5,142,970 A | 9/1992 | ErkenBrack | 99/472 |
| 5,145,001 A | 9/1992 | Valenzuela | 165/164 |
| 5,161,089 A | 11/1992 | Chu et al. | 361/385 |
| 5,199,487 A | 4/1993 | DiFrancesco et al. | 165/168 |
| 5,203,401 A | 4/1993 | Hamburgen et al. | 165/80.4 |
| 5,218,515 A | 6/1993 | Bernhardt | 361/385 |
| 5,228,502 A | 7/1993 | Chu et al. | 165/80.4 |
| 5,232,047 A | 8/1993 | Matthews | 165/168 |
| 5,239,200 A | 8/1993 | Messina et al. | 257/714 |
| 5,239,443 A | 8/1993 | Fahey et al. | 361/689 |
| 5,263,251 A | 11/1993 | Matthews | 29/840.036 |
| 5,265,670 A | 11/1993 | Zingher | 165/80.4 |
| 5,269,372 A | 12/1993 | Chu et al. | 165/80.4 |
| 5,274,920 A | 1/1994 | Matthews | 29/890.039 |
| 5,275,237 A | 1/1994 | Rolfson et al. | 165/80.5 |
| 5,294,834 A | 3/1994 | Fatemi et al. | 257/745 |
| 5,299,635 A | 4/1994 | Abraham | 165/173 |
| 5,307,236 A * | 4/1994 | Rio et al. | 361/720 |
| 5,308,429 A | 5/1994 | Bradley | 156/306.6 |
| 5,309,319 A | 5/1994 | Messina | 361/699 |
| 5,310,440 A | 5/1994 | Zingher | 156/345 |
| 5,316,077 A | 5/1994 | Reichard | 165/104.28 |
| 5,317,805 A | 6/1994 | Hoopman et al. | 29/890.03 |
| 5,325,265 A | 6/1994 | Turlik et al. | 361/702 |
| 5,346,000 A | 9/1994 | Schlitt | 165/104.26 |
| 5,380,956 A | 1/1995 | Loo et al. | 174/252 |
| 5,383,340 A | 1/1995 | Larson et al. | 62/259.2 |
| 5,386,143 A | 1/1995 | Fitch | 257/715 |
| 5,388,635 A | 2/1995 | Gruber et al. | 165/80.4 |
| 5,397,919 A | 3/1995 | Tata et al. | 257/717 |
| 5,421,943 A | 6/1995 | Tam et al. | 156/273.9 |
| 5,424,918 A * | 6/1995 | Felps et al. | 361/704 |
| 5,427,174 A | 6/1995 | Lomolino, Sr. et al. | 165/1 |
| 5,436,793 A | 7/1995 | Sanwo et al. | 361/689 |
| 5,459,099 A | 10/1995 | Hsu | 437/180 |
| 5,490,117 A | 2/1996 | Oda et al. | 365/226 |
| 5,508,234 A | 4/1996 | Dusablon, Sr. et al. | 437/228 |
| 5,514,832 A | 5/1996 | Dusablon, Sr. et al. | 174/15.1 |
| 5,514,906 A | 5/1996 | Love et al. | 257/712 |
| 5,520,244 A | 5/1996 | Mundinger et al. | 165/104.33 |
| 5,544,696 A | 8/1996 | Leland | 165/80.4 |
| 5,548,605 A | 8/1996 | Bennett et al. | 372/36 |
| 5,564,497 A | 10/1996 | Fukuoka et al. | 165/152 |
| 5,575,929 A | 11/1996 | Yu et al. | 216/10 |
| 5,579,828 A | 12/1996 | Reed et al. | 165/83 |
| 5,585,069 A | 12/1996 | Zanzucchi et al. | 422/100 |
| 5,641,400 A | 6/1997 | Kaltenbach et al. | 210/198.2 |
| 5,651,414 A | 7/1997 | Suzuki et al. | 165/104.14 |
| 5,658,831 A | 8/1997 | Layton et al. | 29/832 |
| 5,672,980 A | 9/1997 | Charlton et al. | 324/755 |
| 5,675,473 A | 10/1997 | McDunn et al. | 361/699 |
| 5,692,558 A | 12/1997 | Hamilton et al. | 165/80.4 |
| 5,696,405 A | 12/1997 | Weld | 257/714 |
| 5,703,536 A | 12/1997 | Davis et al. | 330/289 |
| 5,704,416 A | 1/1998 | Larson et al. | 165/104.33 |
| 5,727,618 A | 3/1998 | Mundinger et al. | 165/80.4 |
| 5,731,954 A | 3/1998 | Cheon | 361/699 |
| 5,763,951 A | 6/1998 | Hamilton et al. | 257/714 |
| 5,768,104 A | 6/1998 | Salmonson et al. | 361/704 |
| 5,774,779 A | 6/1998 | Tuchinskiy | 419/2 |
| 5,800,690 A | 9/1998 | Chow et al. | 204/451 |
| 5,801,442 A | 9/1998 | Hamilton et al. | 257/714 |
| 5,810,077 A | 9/1998 | Nakamura et al. | 165/153 |
| 5,811,062 A | 9/1998 | Wegeng et al. | 422/129 |
| 5,830,806 A * | 11/1998 | Hudson et al. | 438/690 |
| 5,835,345 A | 11/1998 | Staskus et al. | 361/699 |
| 5,836,750 A | 11/1998 | Cabuz | 417/322 |
| 5,858,188 A | 1/1999 | Soane et al. | 204/454 |
| 5,863,708 A | 1/1999 | Zanzucchi et al. | 430/320 |
| 5,869,004 A | 2/1999 | Parce et al. | 422/100 |
| 5,870,823 A | 2/1999 | Bezama et al. | 29/848 |
| 5,874,795 A | 2/1999 | Sakamoto | 310/156 |
| 5,876,655 A | 3/1999 | Fisher | 264/319 |
| 5,880,017 A | 3/1999 | Schwiebert et al. | 438/613 |
| 5,880,524 A | 3/1999 | Xie | 257/704 |
| 5,882,248 A | 3/1999 | Wright et al. | 451/285 |
| 5,886,870 A | 3/1999 | Omori | 361/704 |
| 5,901,037 A | 5/1999 | Hamilton et al. | 361/699 |
| 5,909,057 A | 6/1999 | McCormick et al. | 257/704 |
| 5,923,086 A | 7/1999 | Winer et al. | 257/713 |
| 5,927,390 A | 7/1999 | Lehman | 165/122 |
| 5,936,192 A | 8/1999 | Tauchi | 136/203 |
| 5,940,270 A | 8/1999 | Puckett | 361/699 |
| 5,942,093 A | 8/1999 | Rakestraw et al. | 204/450 |
| 5,945,217 A | 8/1999 | Hanrahan | 428/389 |
| 5,960,866 A | 10/1999 | Kimura et al. | 165/104.33 |
| 5,964,092 A | 10/1999 | Tozuka et al. | 62/3.7 |
| 5,965,001 A | 10/1999 | Chow et al. | 204/600 |
| 5,965,813 A | 10/1999 | Wan et al. | 73/204.26 |
| 5,978,220 A | 11/1999 | Frey et al. | 361/699 |
| 5,997,713 A | 12/1999 | Beetz, Jr. et al. | 204/124 |
| 5,998,240 A | 12/1999 | Hamilton et al. | 438/122 |
| 6,007,309 A | 12/1999 | Hartley | 417/322 |
| 6,010,316 A | 1/2000 | Haller et al. | 417/322 |
| 6,013,164 A | 1/2000 | Paul et al. | 204/450 |

| | | | | | | | |
|---|---|---|---|---|---|---|---|
| 6,014,312 | A | 1/2000 | Schulz-Harder et al. ..... 361/699 | 6,444,461 | B1 | 9/2002 | Knapp et al. ............. 435/283.1 |
| 6,019,165 | A | 2/2000 | Batchelder ................. 165/80.3 | 6,449,157 | B1 | 9/2002 | Chu ............................. 361/704 |
| 6,019,882 | A | 2/2000 | Paul et al. ................... 204/450 | 6,449,162 | B1 | 9/2002 | Corbin, Jr. et al. .......... 361/719 |
| 6,021,045 | A | 2/2000 | Johnson ....................... 361/704 | 6,457,515 | B1 | 10/2002 | Vafai et al. ................. 165/80.4 |
| 6,034,872 | A | 3/2000 | Chrysler et al. ............. 361/699 | 6,459,581 | B1 | 10/2002 | Newton et al. ............... 361/700 |
| 6,039,114 | A | 3/2000 | Becker et al. ................ 165/170 | 6,459,582 | B1 | 10/2002 | Ali et al. ...................... 361/704 |
| 6,054,034 | A | 4/2000 | Soane et al. ................. 204/601 | 6,462,951 | B2 | 10/2002 | Letourneau ................... 361/704 |
| 6,058,014 | A | 5/2000 | Choudhury et al. ......... 361/704 | 6,466,442 | B2 | 10/2002 | Lin ............................... 361/695 |
| 6,068,752 | A | 5/2000 | Dubrow et al. .............. 204/604 | 6,469,893 | B1 * | 10/2002 | Frutschy et al. .............. 361/700 |
| 6,084,178 | A | 7/2000 | Cromwell ..................... 174/35 | 6,477,045 | B1 | 11/2002 | Wang ........................... 361/700 |
| 6,086,330 | A | 7/2000 | Press et al. ................... 416/223 | 6,492,200 | B1 | 12/2002 | Park et al. .................... 438/113 |
| 6,090,251 | A | 7/2000 | Sundberg et al. ............. 204/453 | 6,508,301 | B2 | 1/2003 | Marsala ....................... 165/80.4 |
| 6,096,656 | A | 8/2000 | Matzke et al. ................ 438/702 | 6,512,509 | B1 | 1/2003 | McVicar ...................... 361/703 |
| 6,100,541 | A | 8/2000 | Nagle et al. .................. 250/573 | 6,519,151 | B2 | 2/2003 | Chu et al. ..................... 361/699 |
| 6,101,715 | A | 8/2000 | Fuesser et al. ............ 29/890.03 | 6,528,125 | B1 | 3/2003 | Jackson et al. ............... 427/459 |
| 6,105,373 | A | 8/2000 | Watanabe et al. ............. 62/3.7 | 6,536,516 | B2 | 3/2003 | Davies et al. ................. 165/170 |
| 6,119,729 | A | 9/2000 | Oberholzer .................. 138/27 | 6,537,437 | B1 | 3/2003 | Galambos et al. ............ 204/600 |
| 6,126,723 | A | 10/2000 | Drost et al. ...................... 96/4 | 6,543,521 | B1 | 4/2003 | Sato et al. .................... 165/80.3 |
| 6,129,145 | A | 10/2000 | Yamamoto et al. ........... 165/168 | 6,553,253 | B1 | 4/2003 | Chang ........................... 604/20 |
| 6,129,260 | A | 10/2000 | Andrus et al. ................ 228/120 | 6,562,662 | B2 | 5/2003 | Shisshido et al. ............. 438/125 |
| 6,131,650 | A | 10/2000 | North et al. .................. 165/170 | 6,570,248 | B1 | 5/2003 | Ahn et al. ..................... 257/724 |
| 6,140,860 | A | 10/2000 | Sandhu et al. ................ 327/513 | 6,572,749 | B1 | 6/2003 | Paul et al. ..................... 204/450 |
| 6,146,103 | A | 11/2000 | Lee et al. ....................... 417/50 | 6,577,045 | B1 | 6/2003 | Blyablin et al. .............. 313/311 |
| 6,154,363 | A | 11/2000 | Chang ......................... 361/699 | 6,578,626 | B1 | 6/2003 | Calaman et al. .............. 165/80.4 |
| 6,159,353 | A | 12/2000 | West et al. .................... 204/601 | 6,581,388 | B2 | 6/2003 | Novotny et al. ................ 62/3.7 |
| 6,166,907 | A | 12/2000 | Chien ......................... 361/699 | 6,587,343 | B2 | 7/2003 | Novotny et al. .............. 361/698 |
| 6,167,948 | B1 | 1/2001 | Thomas .................. 165/104.26 | 6,588,498 | B1 | 7/2003 | Reyzin et al. ........... 165/104.33 |
| 6,174,675 | B1 | 1/2001 | Chow et al. ...................... 435/6 | 6,591,625 | B1 | 7/2003 | Simon ........................ 62/259.2 |
| 6,176,962 | B1 | 1/2001 | Soane et al. .................. 156/292 | 6,632,655 | B1 | 10/2003 | Mehta et al. ................. 435/288.5 |
| 6,186,660 | B1 | 2/2001 | Kopf-Sill et al. ............. 366/340 | 6,632,719 | B1 | 10/2003 | DeBoer et al. ............... 438/381 |
| 6,196,307 | B1 | 3/2001 | Ozmat ......................... 165/185 | 6,643,132 | B2 | 11/2003 | Faneuf et al. ................. 361/700 |
| 6,206,022 | B1 | 3/2001 | Tsai et al. .................. 137/15.18 | 6,651,735 | B2 | 11/2003 | Cho et al. ................. 165/104.26 |
| 6,216,343 | B1 | 4/2001 | Leland et al. ........... 29/890.032 | 6,670,699 | B2 | 12/2003 | Mikubo et al. ............... 257/678 |
| 6,221,226 | B1 | 4/2001 | Kopf-Sill ..................... 204/602 | 6,678,168 | B2 | 1/2004 | Kenny et al. ................. 361/764 |
| 6,227,287 | B1 | 5/2001 | Tanaka et al. ............... 165/80.4 | 6,679,315 | B2 | 1/2004 | Cosley et al. ............... 165/80.4 |
| 6,227,809 | B1 | 5/2001 | Forster et al. ................. 417/53 | 6,680,044 | B1 | 1/2004 | Tonkovich et al. ........... 423/652 |
| 6,234,240 | B1 | 5/2001 | Cheon ......................... 165/80.3 | 6,699,791 | B2 | 3/2004 | Hofmann et al. ............. 438/692 |
| 6,238,538 | B1 | 5/2001 | Parce et al. ................... 204/600 | 6,700,785 | B2 | 3/2004 | Berry et al. .................. 361/726 |
| 6,253,832 | B1 | 7/2001 | Hallefalt ...................... 164/502 | 6,724,632 | B2 | 4/2004 | Lee et al. ..................... 361/719 |
| 6,253,835 | B1 | 7/2001 | Chu et al. .................... 165/80.4 | 6,729,383 | B1 | 5/2004 | Cannell et al. ............... 165/80.3 |
| 6,253,836 | B1 | 7/2001 | Mitchell ....................... 165/86 | 6,743,664 | B2 | 6/2004 | Liang et al. ................... 438/124 |
| 6,257,320 | B1 | 7/2001 | Wargo ......................... 165/80.4 | 6,757,169 | B2 | 6/2004 | Kondo et al. ................. 361/699 |
| 6,277,257 | B1 | 8/2001 | Paul et al. ..................... 204/450 | 6,763,880 | B1 | 7/2004 | Shih ............................ 165/80.4 |
| 6,282,093 | B1 | 8/2001 | Goodwin ..................... 204/450 | 6,775,996 | B2 | 8/2004 | Cowans ........................ 62/160 |
| 6,301,109 | B1 | 10/2001 | Chu et al. ..................... 361/690 | 6,787,052 | B1 | 9/2004 | Vaganov ........................ 216/57 |
| 6,313,992 | B1 | 11/2001 | Hildebrandt ................. 361/700 | 6,787,899 | B2 | 9/2004 | Rinella et al. ................. 257/712 |
| 6,317,326 | B1 | 11/2001 | Vogel et al. .................. 361/704 | 6,795,312 | B2 | 9/2004 | Narakino et al. ............. 361/687 |
| 6,321,791 | B1 | 11/2001 | Chow ........................... 137/833 | 6,796,372 | B2 | 9/2004 | Bear ........................ 165/104.21 |
| 6,322,753 | B1 | 11/2001 | Lindberg et al. ............. 422/102 | 6,836,131 | B2 | 12/2004 | Cader et al. ................... 324/760 |
| 6,324,058 | B1 | 11/2001 | Hsiao .......................... 361/699 | 6,881,039 | B2 | 4/2005 | Corbin et al. .................. 417/48 |
| 6,324,075 | B1 | 11/2001 | Unrein et al. ................. 361/816 | 6,882,543 | B2 | 4/2005 | Kenny et al. ................. 361/704 |
| 6,337,794 | B1 | 1/2002 | Agonafer et al. ............ 361/690 | 6,955,212 | B1 | 10/2005 | Hsieh .......................... 165/80.4 |
| 6,347,036 | B1 | 2/2002 | Yeager et al. ................ 361/687 | 6,972,485 | B2 | 12/2005 | Kong et al. ................... 257/704 |
| 6,351,384 | B1 | 2/2002 | Darkoku et al. .............. 361/704 | 6,977,816 | B2 | 12/2005 | Lee et al. ..................... 361/704 |
| 6,360,814 | B1 | 3/2002 | Tanaka et al. ........... 165/104.33 | 6,988,534 | B2 | 1/2006 | Kenny et al. ................. 165/80.4 |
| 6,366,462 | B1 | 4/2002 | Chu et al. ..................... 361/699 | 6,988,535 | B2 | 1/2006 | Upadhya et al. ............. 165/80.4 |
| 6,366,467 | B1 | 4/2002 | Patel et al. .................... 361/760 | 6,992,891 | B2 | 1/2006 | Mallik et al. ................. 361/704 |
| 6,367,544 | B1 | 4/2002 | Calaman ..................... 165/135 | 6,994,151 | B2 | 2/2006 | Zhou et al. ................... 165/80.4 |
| 6,374,906 | B1 | 4/2002 | Peterson et al. ............. 165/80.3 | 7,000,684 | B2 | 2/2006 | Kenny et al. ................. 165/80.4 |
| 6,381,813 | B1 | 5/2002 | Lai ............................... 24/456 | 7,009,843 | B2 | 3/2006 | Lee et al. ..................... 165/704 |
| 6,385,044 | B1 | 5/2002 | Colbert et al. ................ 361/700 | 7,019,972 | B2 | 3/2006 | Kenny, Jr. et al. ............ 165/80.4 |
| 6,388,317 | B1 | 5/2002 | Reese ......................... 257/713 | 7,021,369 | B2 | 4/2006 | Werner et al. ........... 165/104.33 |
| 6,396,706 | B1 | 5/2002 | Wohlfarth .................... 361/760 | 7,044,196 | B2 | 5/2006 | Shook et al. ................. 165/80.3 |
| 6,397,932 | B1 | 6/2002 | Calaman et al. .............. 165/80.4 | 7,156,159 | B2 | 1/2007 | Lovette et al. .......... 165/104.33 |
| 6,400,012 | B1 | 6/2002 | Miller et al. .................. 257/712 | 7,243,704 | B2 * | 7/2007 | Tustaniwskyi et al. ...... 165/80.2 |
| 6,406,605 | B1 | 6/2002 | Moles ......................... 204/601 | 7,280,363 | B2 * | 10/2007 | Reyzin et al. ................ 361/719 |
| 6,415,860 | B1 | 7/2002 | Kelly et al. ................... 165/748 | 7,301,773 | B2 * | 11/2007 | Brewer et al. ................ 361/719 |
| 6,417,060 | B2 | 7/2002 | Tavkhelidze et al. ........ 438/380 | 7,455,103 | B2 | 11/2008 | Sato et al. .................... 165/299 |
| 6,424,531 | B1 | 7/2002 | Bhatti et al. .................. 361/704 | 2001/0004313 | A1 | 6/2001 | Yamaoka ..................... 361/784 |
| 6,425,515 | B2 | 7/2002 | Mays et al. .................. 228/103 | 2001/0006874 | A1 | 7/2001 | Moore ............................. 451/5 |
| 6,431,260 | B1 | 8/2002 | Agonafer et al. ............ 165/80.4 | 2001/0016985 | A1 | 8/2001 | Insley et al. ............. 29/890.039 |
| 6,437,981 | B1 | 8/2002 | Newton et al. ............... 361/700 | 2001/0024820 | A1 | 9/2001 | Mastromatteo et al. .. 435/287.2 |
| 6,443,222 | B1 | 9/2002 | Yun et al. .................. 165/104.26 | 2001/0044155 | A1 | 11/2001 | Paul et al. ..................... 436/161 |

| | | | | | | |
|---|---|---|---|---|---|---|
| 2001/0045270 A1 | 11/2001 | Bhatti et al. ............... 165/80.3 | | 2005/0214173 A1 | 9/2005 | Facer et al. .................. 422/100 |
| 2001/0046703 A1 | 11/2001 | Burns et al. .............. 435/303.1 | | 2005/0247433 A1 | 11/2005 | Corrado et al. ............ 165/80.4 |
| 2001/0055714 A1 | 12/2001 | Cettour-Rose et al. ....... 429/122 | | 2005/0257532 A1 | 11/2005 | Ikeda et al. ..................... 62/3.7 |
| 2002/0011330 A1 | 1/2002 | Insley et al. .................. 165/133 | | 2005/0259393 A1 | 11/2005 | Vinson et al. ................ 361/690 |
| 2002/0051341 A1* | 5/2002 | Frutschy et al. .............. 361/700 | | 2005/0270742 A1* | 12/2005 | Brewer et al. ................ 361/696 |
| 2002/0075645 A1 | 6/2002 | Kitano et al. ................. 361/687 | | 2006/0037739 A1 | 2/2006 | Utsunomiya ............ 165/104.33 |
| 2002/0121105 A1 | 9/2002 | McCarthy, Jr. et al. ......... 62/500 | | 2006/0056156 A1* | 3/2006 | Long et al. ................... 361/704 |
| 2002/0134543 A1 | 9/2002 | Estes et al. ................... 165/277 | | 2006/0060333 A1 | 3/2006 | Chordia et al. ......... 165/104.33 |
| 2003/0062149 A1 | 4/2003 | Goodson et al. ........ 165/104.11 | | 2006/0102999 A1* | 5/2006 | Tustaniwskyi et al. ...... 257/688 |
| 2003/0121274 A1 | 7/2003 | Wightman .................... 62/222 | | 2006/0139882 A1 | 6/2006 | Mikubo et al. ............... 361/699 |
| 2003/0123228 A1* | 7/2003 | Bhatia et al. .................. 361/705 | | 2006/0161311 A1 | 7/2006 | Vinson et al. ................ 700/300 |
| 2003/0213580 A1 | 11/2003 | Philpott et al. ................. 165/46 | | 2006/0164807 A1 | 7/2006 | Reyzin et al. ................ 361/699 |
| 2004/0040695 A1 | 3/2004 | Chesser et al. .......... 165/104.21 | | 2006/0187639 A1 | 8/2006 | Carswell ...................... 361/699 |
| 2004/0052049 A1 | 3/2004 | Wu et al. ..................... 361/699 | | 2008/0013283 A1 | 1/2008 | Gilbert et al. ................ 361/715 |
| 2004/0089008 A1 | 5/2004 | Tilton et al. ................. 62/259.2 | | | | |
| 2004/0099410 A1 | 5/2004 | Ghosh ......................... 165/185 | | | FOREIGN PATENT DOCUMENTS | |
| 2004/0112571 A1 | 6/2004 | Kenny et al. ............... 165/80.3 | | | | |
| 2004/0125561 A1 | 7/2004 | Gwin et al. .................. 361/699 | | JP | 6-326226 | 11/1994 |
| 2004/0160741 A1 | 8/2004 | Moss et al. .................. 361/699 | | JP | 9-102568 | 4/1997 |
| 2004/0188069 A1 | 9/2004 | Tomioka et al. ......... 165/104.33 | | JP | 10223811 | 8/1998 |
| 2004/0188076 A1 | 9/2004 | Lee ............................. 165/174 | | JP | 306614 | 3/2005 |
| 2004/0206477 A1 | 10/2004 | Kenny et al. ............... 165/80.4 | | TW | 402680 | 9/2000 |
| 2004/0216863 A1 | 11/2004 | Hu ............................. 165/110 | | TW | 449040 | 8/2001 |
| 2004/0221604 A1 | 11/2004 | Ota et al. .................. 62/259.2 | | TW | 0502102 | 9/2002 |
| 2005/0082666 A1 | 4/2005 | Lee et al. ..................... 257/728 | | TW | 516810 | 1/2003 |
| 2005/0111797 A1 | 5/2005 | Sherrer et al. | | TW | 0306614 | 2/2007 |
| 2005/0133200 A1 | 6/2005 | Malone et al. ............. 165/80.4 | | | | |
| 2005/0211427 A1 | 9/2005 | Kenny et al. | | * cited by examiner | | |

GIMBALLED ATTACHMENT FOR MULTIPLE HEAT EXCHANGERS

RELATED APPLICATION

This patent application is a continuation in part of U.S. patent application Ser. No. 10/945,807, filed Sep. 20, 2004 now U.S. Pat. No. 7,301,773, and entitled "SEMI-COMPLIANT JOINING MECHANISM FOR SEMICONDUCTOR COOLING APPLICATIONS", hereby incorporated by reference, which claims priority under 35 U.S.C. 119 (e) of the co-pending U.S. Provisional Patent Application Ser. No. 60/577,262 filed Jun. 4, 2004, and entitled "MULTIPLE COOLING TECHNIQUES". This patent application also claims priority under 35 U.S.C. 119 (e) of the co-pending U.S. Provisional Patent Application Ser. No. 60/797,955 filed May 4, 2006, and entitled "LIQUID COOLING THROUGH REMOTE DRIVE BAY HEAT EXCHANGER". The Provisional Patent Application Ser. 60/797,955 filed May 4, 2006, and entitled "LIQUID COOLING THROUGH REMOTE DRIVE BAY HEAT EXCHANGER" is also hereby incorporated by reference.

FIELD OF THE INVENTION

The invention relates to a method and apparatus for joining two interfaces. In particular, the invention relates to a semi-compliant joining mechanism used to join a heat collecting apparatus and a heat generating source in semiconductor cooling applications.

BACKGROUND OF THE INVENTION

As integrated circuits increase in size and complexity, dissipating the increasing amount of heat being generated by these integrated circuits is critical. As the high end for thermal solutions increases, so does the size of the cooling systems used to provide such thermal solutions. Unfortunately, larger cooling systems include more mass. Where a thermal interface is necessary, mounting such a cooling system becomes more challenging and often leads to damage of the cooling system or surrounding components, including the integrated circuit to be cooled.

Further, when a heat exchanger is attached to a heat source via a thermal interface material, the thermal resistance of the thermal interface material contributes to the overall thermal resistance. Wide variations in the values of the thermal interface material resistance can exist.

Non-uniform thickness of the thermal interface material often result due to the mounting process, thereby resulting in a non-uniform thermal resistance across the thermal interface. If a uni-directional force is used to engage the heat exchanger to the heat source, any non-parallel configuration or alignment of either mating surface will result in an uneven thermal interface between the two.

In a related issue, many heat sources are positioned relatively closely to each other. Attaching a heat exchanger to each heat source requires a mounting mechanism to be used on each heat exchanger. In some configurations, if two adjacent heat sources are too close together, there is not enough space for two corresponding mounting mechanism to also be attached. In such situations, a trade-off is required where a first heat exchanger is mounted using a first type of mounting mechanism, but a second adjacent heat exchanger is mounted using a second type of mounting mechanism, which is often less effective or convenient. For example, the second heat exchanger may be adhered directly to the heat source, which eliminates the ability to easily remove the heat exchanger, and can result in a thermal interface with different thermal characteristics than those resulting from the first type of mounting mechanism.

There is therefore a need for a more effective mounting or joining mechanism to provide a thermal interface between a cooling system and a heat source. There is also a need for a more effective mounting or joining mechanism to provide thermal interfaces between multiple cooling systems and multiple heat sources.

SUMMARY OF THE INVENTION

In one aspect, a joining system includes a plurality of heat generating devices mounted to a mounting apparatus, a plurality of heat exchangers, each heat exchanger coupled to a corresponding heat generating device, and a gimbal retention mechanism including a plurality of gimbal joints and one or more spring means, wherein the one or more spring means couple the gimbal retention mechanism to the mounting apparatus, and the plurality of gimbal joints couple the gimbal retention mechanism to the plurality of heat exchangers thereby coupling each heat exchanger to the corresponding heat generating device.

In another aspect, a joining system includes a heat generating device mounted to a mounting apparatus, a heat rejector coupled to the heat generating device, wherein the heat rejector includes a plurality of fins, and a gimbal retention mechanism including a gimbal joint and one or more spring means, wherein the gimbal joint is coupled to the heat rejector and the one or more spring means are coupled to the mounting apparatus, thereby coupling the heat rejector to the heat generating device.

In yet another aspect, a joining system includes a heat generating device mounted to a mounting apparatus, a heat pipe assembly coupled to the heat generating device, wherein the heat pipe assembly includes a heat spreader coupled to the heat generating device, one or more heat pipes coupled to the heat spreader, and a plurality of fins coupled to the one or more heat pipes, and a gimbal retention mechanism including a gimbal joint and one or more spring means, wherein the gimbal joint is coupled to the heat spreader and the one or more spring means are coupled to the mounting apparatus, thereby coupling the heat rejector to the heat generating device.

DETAILED DESCRIPTION OF THE PRESENT INVENTION

Figure 1:
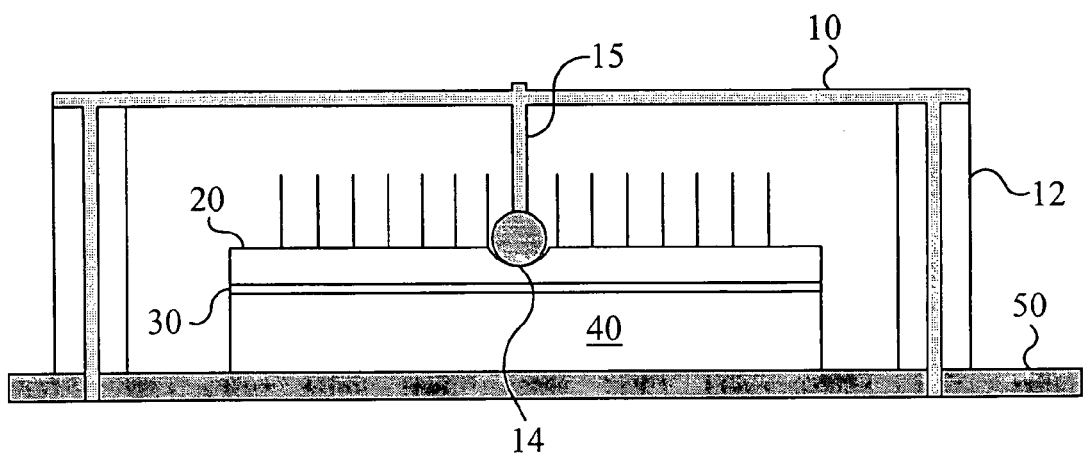
FIG. 1 illustrates a joining mechanism configured to couple a single heat exchanger to a single heat source.

Embodiments of the present invention include a semi-compliant joining mechanism used for generating repairable low thermal resistance interfaces between a heat exchanging device and a heat generating source. The interfaces are preferably used in semiconductor cooling applications. As used herein, references to a heat exchanging device, a heat exchanging apparatus, a heat collector, a micro-heat exchanger, a heat exchanger, and the like are used interchangeably and refer in general to any apparatus capable of exchanging heat with an external heat source. Specific examples of a heat exchanging device include, but are not limited to, an extruded fin heat sink, a crimped fin heat sink, a heat pipe assembly, a vapor chamber, a thermal siphon, a micro-channel heat exchanger as part of a liquid cooling system, a cold plate as part of a liquid cooling system, an injection molded heat sink, or a forged heat sink. Also as used herein, references to a heat source, a heat generating source, a heat generating device, and the like, as well as specific references to exemplary heat generating devices such as an integrated circuit, an integrated microprocessor circuit, and a semiconductor heat source, are used interchangeably and refer in general to any apparatus or source capable of generating heat. The joining mechanism of the present invention is used to couple one or more heat exchanging devices to one or more corresponding heat sources, each independently coupled through a semi-compliant gimbal joint. The joining mechanism enables a robust, reliable, and re-workable heat transfer interface between the heat exchanging device and a heat source, such as an integrated circuit.

The heat exchanging device is preferably mounted to the heat source using a gimbal plate. The gimbal plate preferably includes a single-point contact feature, such as a ball, a hemispherical surface, a point, or other shapes such as an ellipsoid. The single-point contact feature joins with a mating feature on the heat exchanging device. In an alternative embodiment, the heat exchanging device includes the single-point contact feature and the gimbal plate includes the mating feature. The single-point contact feature and the mating feature are collectively referred to as a gimbal joint. The gimbal joint enables application of a retaining force to the heat exchanging device as a single-point load. Due to the configuration of the gimbal joint, an application vector of the retaining force is automatically adjusted such that the heat exchanging device self-planarizes to the heat source. In other words, a plane of the mating surface of the heat exchanging device self aligns to a plane of the mating surface of the heat source. This results in a balanced and centered application of the retaining force over the thermal interface area between the heat source and the heat exchanging device. An even distribution of the retaining force during application of the heat exchanging device to the heat source consequently leads to an even distribution of a thermal interface material between the two corresponding mating surfaces. This even distribution provides a low mean thermal resistance and narrow distribution of values about this mean.

In the preferred embodiment, the heat source is an integrated circuit, and the integrated circuit is mounted to a circuit board. The gimbal plate is preferably mounted directly to the circuit board using spring means. Alternatively, the gimbal plate is mounted to the circuit board through an intermediate bracket attached to the circuit board. Still alternatively, the gimbal plate itself includes a spring force used solely or in combination with other spring means. An example of such a gimbal plate is a stamped spring steel plate. The spring means include a series of fasteners (screws), springs, and/or spring plates, which regulate the amount of retaining force applied to the heat source by the heat exchanging device at the thermal interface. In other words, the spring means regulates the amount of the retaining force directed through the gimbal joint to the heat exchanging device. As the fasteners on the gimbal plate are tightened, the retaining force is applied to the heat exchanging device through the gimbal-joint, forcing the mating surfaces of the heat exchanging device and the heat source together. Because the gimbal joint is rotation-compliant, the two mating faces making up the thermal interface are forced into a parallel mate. The two mating surfaces are unaffected by any asymmetry in the forces, such as the top mating surface of the integrated circuit being non-parallel to the circuit board to which it is mounted, that are acting on the mounting hardware of the gimbal plate. In this manner, a Thermal Interface Material (TIM) interface, between the heat exchanging device and the heat source, with high thermal performance and dimensional stability is generated. It will be appreciated that any commercially available TIM material can be used with the gimbal joint of the present invention.

FIG. 1 illustrates a joining mechanism configured to couple a single heat exchanger 20 to a single heat source 40 via a force retention means, thereby forming a thermal interface 30 between the heat exchanger 20 and the heat source 40. The retention force is imparted to the heat exchanger 20 via a gimbal joint 14. The gimbal joint 14 is coupled to a bottom surface of a gimbal plate 10 and to a top surface of the heat exchanger 20. The gimbal joint 14 is configured to be rotationally-compliant.

In the preferred embodiment, the heat source 40 is an integrated circuit. The integrated circuit 40 is mounted to a circuit board 50. The circuit board 50 can be mounted directly to a chassis (not shown) or can be mounted to one or more other circuit boards, such as a mother board, which are in turn mounted to the chassis.

The gimbal plate 10 includes a plurality of mounting stands 12. In the preferred embodiment, there are 4 mounting stands 12. The mounting stands 12 protrude from a bottom surface of the gimbal plate 10. Alternatively, the gimbal plate includes 3 or more mounting stands.

The gimbal joint 14 is preferably positioned at a geometric center position of the mounting stands 12. The mounting stands 12 are preferably coupled to the circuit board 50 such that the gimbal joint 14 is aligned with a geometric center position of the heat exchanger 20. The gimbal joint 14 includes two mating components, a single-point contact and a receiver. Examples of the two mating components include, but are not limited to, a ball-in-socket, a hemispherical feature and a concave mating face, a free ball bearing between two concave hemispherical features, or a trapped ball bearing which mates with a concave hemispherical feature. The receiver can also be a depression in which the sides of the depression are convex. Further, the receiver can be any of the concave or convex mating faces described above with a thru-hole at a bottom portion of the depression. In the preferred embodiment, the single-point contact is a ball coupled to a first end of a post 15, where a second end of the post 15 is coupled to a bottom surface of the gimbal plate 10. The ball of the gimbal joint is coupled to a concave receiving depression on a top surface of the heat exchanger 20. Alternatively, the ball of the gimbal joint 14 is coupled directly to the bottom surface of the gimbal plate 10 and the mounting stands 12 are configured at a height such that the ball is positioned in the receiving depression on the heat exchanger. Still alternatively, the single-point contact can be a point, provided the design of the heat exchanger is robust enough to survive the force provided through the point. The locations of the two mating components can also be reversed. That is, the top surface of the heat exchanger can include the single-point contact, such as a ball secured to a top surface of the heat exchanger and a receiving depression in the bottom surface of the gimbal plate.

In some embodiments, the post 15 is attached to a bottom surface of the gimbal plate 10 and the distance between the bottom surface of the gimbal plate 10 and the gimbal joint 14 is fixed. In other embodiments, the post 15 is adjustable relative to the gimbal plate 10, therefore enabling the distance between the bottom surface of the gimbal plate 10 and the gimbal joint 14 to be varied. One such configuration includes a gimbal plate with a threaded thru-hole, and a post with at least one end threaded. The post screws into the threaded thru-hole. An additional locking nut can be used to fix the threaded position of the post within the thru-hole. The distance between the bottom surface of the gimbal plate and the gimbal joint is adjusted by screwing or unscrewing the post. In this manner, the distance between the bottom surface of the gimbal plate and the gimbal joint can be adjusted to match the height of the receiving element on the heat exchanger.

Figure 11:
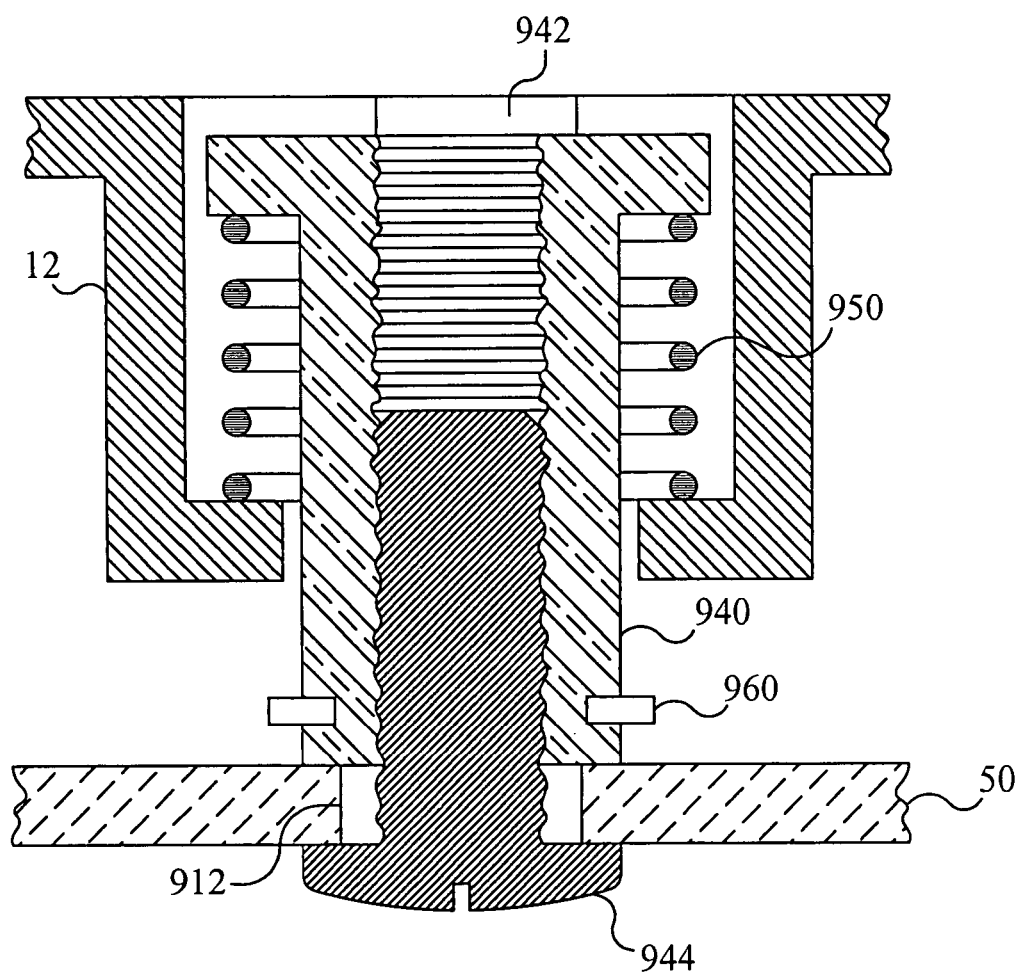
FIG. 11 illustrates a cross-sectional view of a first configuration for coupling each mounting stand to the circuit board.

The gimbal plate 10 includes spring means to mount the gimbal plate 10 to the circuit board 50 and to generate a retaining force which is to be directed through the gimbal joint 14 onto the heat exchanger 20. In some embodiments, the spring means is included within the mounting stands 12. An example of such spring means is included in the co-owned U.S. patent application Ser. No. 10/945,807, filed Sep. 20, 2004, and entitled "Semi-Compliant Joining Mechanism for Semiconductor Cooling Applications" which is hereby incorporated in its entirety by reference. FIG. 11 illustrates a cross-sectional view of a first configuration for coupling each mounting stand 12 to the circuit board 50. A set of one spring 950, one trapped plunger 940, and one retainer ring 960 is associated with each mounting stand 12. Spring 950 is positioned within mounting stand 12. Trapped plunger 940 fits within the spring 950 such that a bottom end of the trapped plunger 940 fits through a hole in the bottom of the mounting stand 12. The bottom end of the trapped plunger 940 is held in place by the retainer ring 960. A top end of the trapped plunger 940 includes a shoulder that rests on top of the spring 950. In this first configuration, the trapper plunger 940 is internally threaded to accept a screw 944. The screw 944 passes through an aperture 912 in the circuit board 50 and mates with the threads of the trapped plunger 940. As the screw 944 is tightened, the trapped plunger 940 contracts the spring 950, thereby generating a retaining force that is applied through the gimbal joint 14 (FIG. 1). In some embodiments, each of the trapped plungers 940 include a key 942 to prevent rotation, allowing for one-tool installation from the back side of the circuit board 50.

Figure 12:
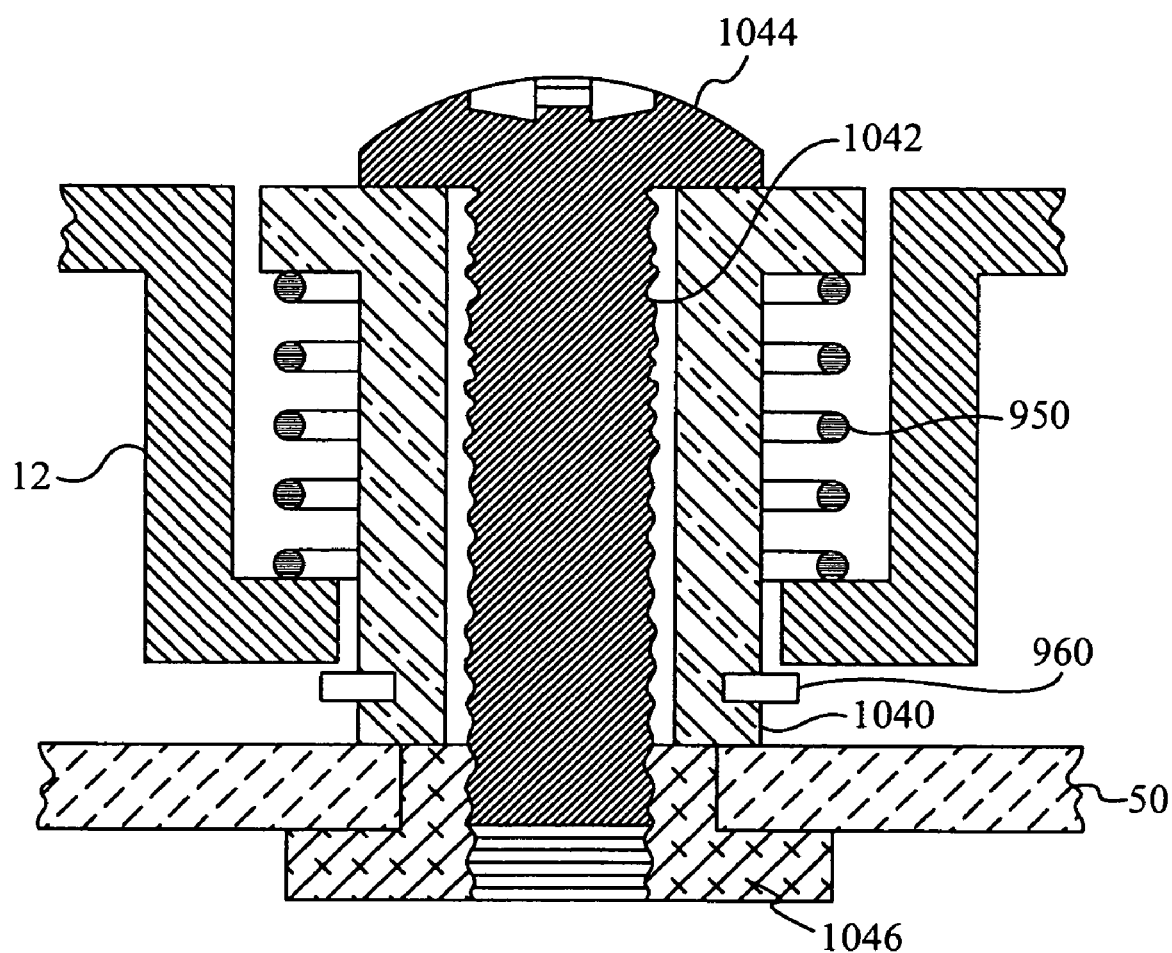
FIG. 12 illustrates a cross-sectional view of a second configuration for coupling each mounting stand to the circuit board.

FIG. 12 illustrates a cross-sectional view of a second configuration for coupling each mounting stand 12 to the circuit board 50. A trapped plunger 1040 includes a clearance aperture 1042 through which a screw 1044 is placed. The clearance aperture 1042 is not threaded. The screw 1044 mates with a threaded back-side plate 1046 on the circuit board 50. The threaded back-side plate 1046 can also be a thread nut or a threaded insert. A top of the screw 1044 presses against the trapped plunger 1040. Upon tightening the screw 1044, downward pressure is applied to the trapped plunger 1040, which contracts the spring 950. Contraction of the spring 950 generates the retaining force. The second configuration enables installation of the gimbal plate 10 (FIG. 1) from the front-side of the circuit board 50.

Preferably, each set of trapped plunger 940 and spring 950 contribute equally to the overall retaining force applied to the gimbal joint 14. The retaining force is regulated by the amount of thread on the trapped plunger 940 when the threads are fully engaged, and by the spring force of the spring 950. The spring 950 can be any type of spring, such as polymer, coil, or wavy. In this manner, a controlled amount of retaining force is provided between the heat exchanger 20 and the integrated circuit 40. However, the circuit board 50 acts as a limiter such that over tightening does not lead to excess retaining force being applied to the heat exchanger 20. Such a fail safe prevents damage to the heat exchanger 20 or the integrated circuit 40.

Figure 13:
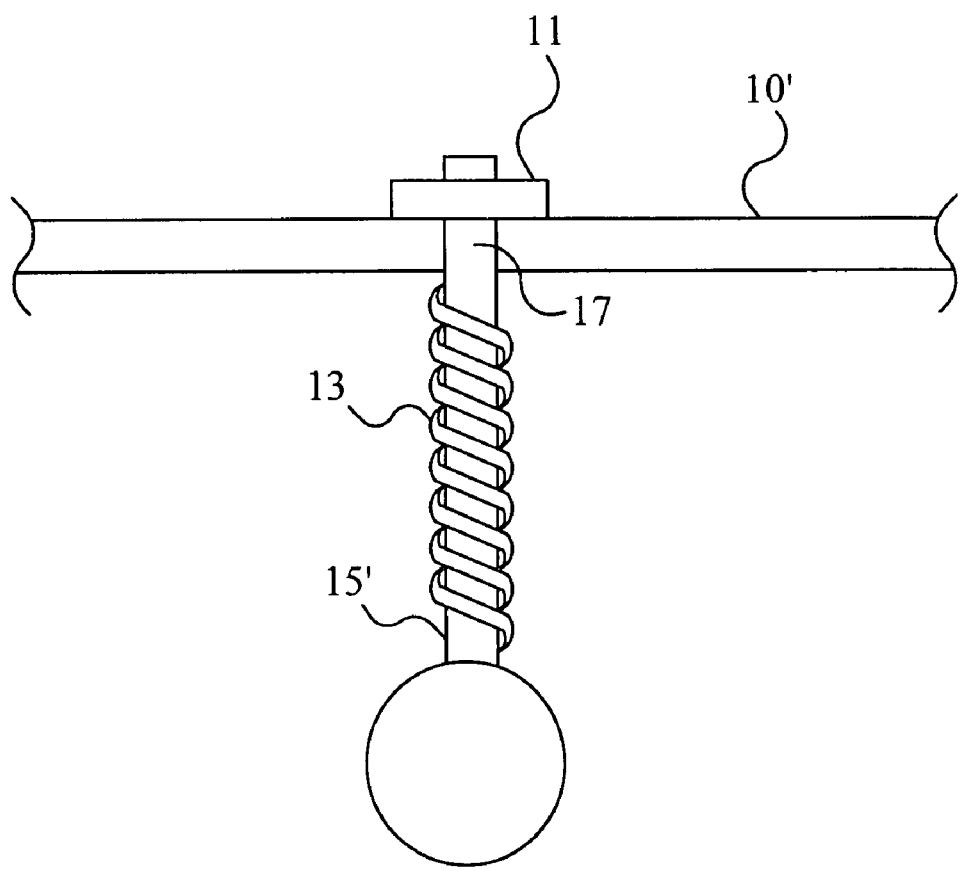
FIG. 13 illustrates a side view of an exemplary configuration of a gimbal post and gimbal plate modified to include spring means.

In some embodiments, the spring means is included as part of the post and gimbal plate. FIG. 13 illustrates a side view of an exemplary configuration of a gimbal post and gimbal plate modified to include spring means. The gimbal plate 10 and the post 15 from the joining mechanism of FIG. 1 are modified as gimbal plate 10' and gimbal post 15'. The modified gimbal plate 10' includes a thru-hole 17 and a locking nut 11. The gimbal post 15' is configured to slide within the thru-hole 17. The locking nut 11 prevents the post 15' from sliding completely through the thru-hole 17. In some embodiments, the locking nut 11 is permanently affixed to the post 15'. In other embodiments, the locking nut 11 and an end portion of the post 15' are threaded. A spring 13 is coupled to the gimbal post 15'. The retention force applied through the gimbal joint 14 (FIG. 1) is generated by the spring 13. Mounting the gimbal plate 10' to the circuit board 50 (FIG. 1), via the mounting stands 12 (FIG. 1), brings the single-point contact element, which is exemplified by the ball at the end of the gimbal post 15' in FIG. 13, of the gimbal joint 14 into contact with the receiving element on the heat exchanger 20 (FIG. 1), thereby forcing the post 15' upward relative to FIG. 13 and compressing the spring 13.

Alternatively, prior to mounting of the gimbal plate 10', the spring 13 is compressed by forcing the post 15' further into the thru-hole (upward relative to FIG. 13). The post 15', and therefore the spring 13, are held in this compressed position by the locking nut 11. In this case, the locking nut 1 and the end portion of the post 15' are threaded. In this compressed position, the single-point contact element of the gimbal joint 14 doe not contact the receiving element on the heat exchanger 20 (FIG. 1). Once the gimbal plate 10' is mounted, the post 15' is released by unscrewing the locking nut 11, thereby forcing the single-point contact element on the end of the post 15' to contact the receiving element on the heat exchanger 20.

A method of coupling the heat exchanger 20 to the integrated circuit 40 is now described in relation to FIG. 1. The single point contact of the gimbal joint 14 on the post 15 is placed against the receiving depression of the gimbal joint 14 on the top surface of the heat exchanger 20. A bottom surface of the heat exchanger 20 is placed against a top surface of the integrated circuit 40, or a thermal interface material positioned therebetween. Due to the rotational-compliance of the gimbal joint 14, as the heat exchanger 20 is brought into contact with the integrated circuit 40, the gimbal joint 14 enables the bottom surface of the heat exchanger 20 to move into a substantially parallel alignment with the top surface of the integrated circuit 40. To cause the mating surfaces of the heat exchanger 20 and the integrated circuit 40 to be presented effectively, a center of rotation of the receiving depression on the heat exchanger 20 is preferably positioned to be collinear with the face-centered normal of the integrated circuit 40. The receiving depression on the heat exchanger 20 is also positioned to be collinear with the face-centered normal of the thermal interface surface of the heat exchanger 20.

The retaining force generated by the spring means is directed through the gimbal joint 14 to the heat exchanger 200. Since the center of rotation of the gimbal joint 14 is collinear with the face-centered normal lines of both the heat exchanger 200 and the integrated circuit 40, the retaining force is applied normal to the face of the integrated circuit 40. The retaining force moves the bottom surface of the heat exchanger 20 against the top surface of the integrated circuit 40 to form the thermal interface 30. As the gimbal's center of rotation is collinear to the face-centered normal of the integrated circuit 40, a symmetric, even distribution of force is guaranteed at the thermal interface, causing the bottom surface of heat exchanger 20 to be properly presented to the top surface of the integrated circuit 40, thereby forming a substantially evenly distributed thermal interface 30.

Figure 2:
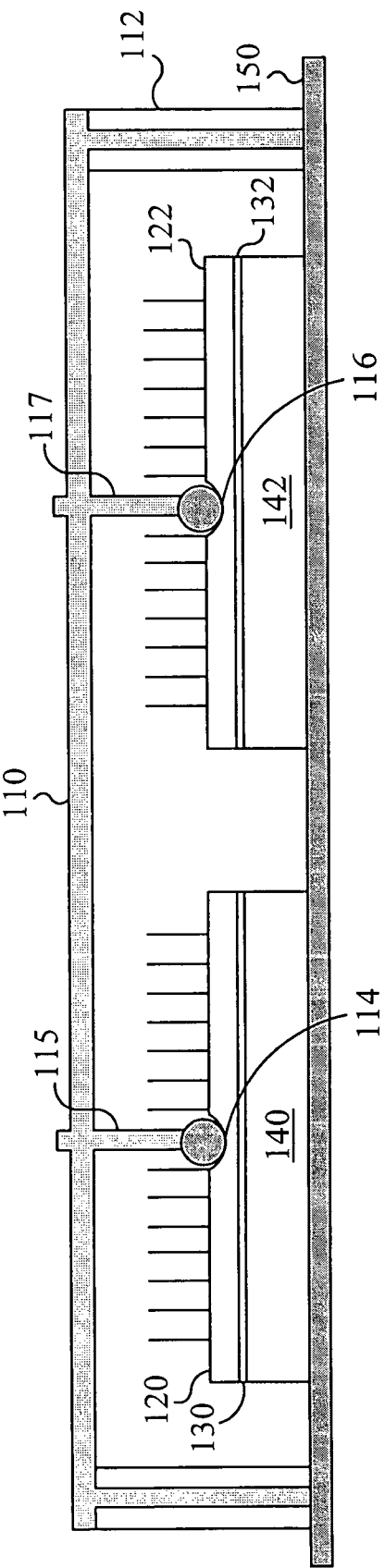
FIG. 2 illustrates a joining mechanism configured to couple two heat exchangers to two heat sources using a single joining mechanism.

The gimbaling technique described above can be applied to situations where multiple heat sources are to be cooled. FIG. 2 illustrates a joining mechanism configured to couple two heat exchangers to two heat sources using a single joining mechanism. The joining mechanism shown in FIG. 2 is configured similarly to the joining mechanism of FIG. 1 except that the joining mechanism of FIG. 2 is configured with two gimbaling joints, which are used to coupled two heat exchangers to two corresponding heat sources. A single heat exchanger 120 is coupled to single heat source 140 via a force retention means, thereby forming a thermal interface 130 between the heat exchanger 120 and the heat source 140. A single heat exchanger 122 is coupled to a single heat source 142 via the force retention means, thereby forming a thermal interface 132 between the heat exchanger 122 and the heat source 142. Each of the heat sources 140 and 142 are coupled to a circuit board 150. The retention force is imparted to the heat exchanger 120 via a post 115 and a gimbal joint 114, and to the heat exchanger 122 via a post 117 and a gimbal joint 116. The gimbal joint 114 and the gimbal joint 116 are coupled to a bottom surface of a gimbal plate 110. The gimbal joint 114 and the gimbal joint 116 are each configured similarly as the gimbal joint 14 (FIG. 1).

The gimbal plate 110 includes a plurality of mounting stands 112, which are each mounted to the circuit board 150. The gimbal plate 110 and mounting stands 112 are mounted to the circuit board 150 in a similar manner as the gimbal plate 10 (FIG. 1) and the mounting stands 12 (FIG. 1) are mounted to the circuit board 50 (FIG. 1), as described above. The resulting retaining force is applied to each the gimbal joint 114 and the gimbal joint 116. The gimbal point 114 is positioned against a top surface of the heat exchanger 120, and the gimbal joint 116 is positioned against a top surface of the heat exchanger 122. The gimbal joint 114 is preferably positioned at a geometric center position of the heat exchanger 120, and the gimbal joint 116 is preferably positioned at a geometric center position of the heat exchanger 122.

In the two gimbal joint configuration of FIG. 2, each of the two heat exchangers 120, 122 independently planarize to their respective heat sources 140, 142. In other words, the heat exchanger 120 self-planarizes to the heat source 140, and the heat exchanger 122 self-planarizes to the heat source 142, independently of each other. The gimballing retention force structure including the gimbal plate 110 and the mounting stands 112 is a single structure as shown in FIG. 2. The gimballing retention force structure has two gimbal joints, one for each heat exchanger.

Figure 3:
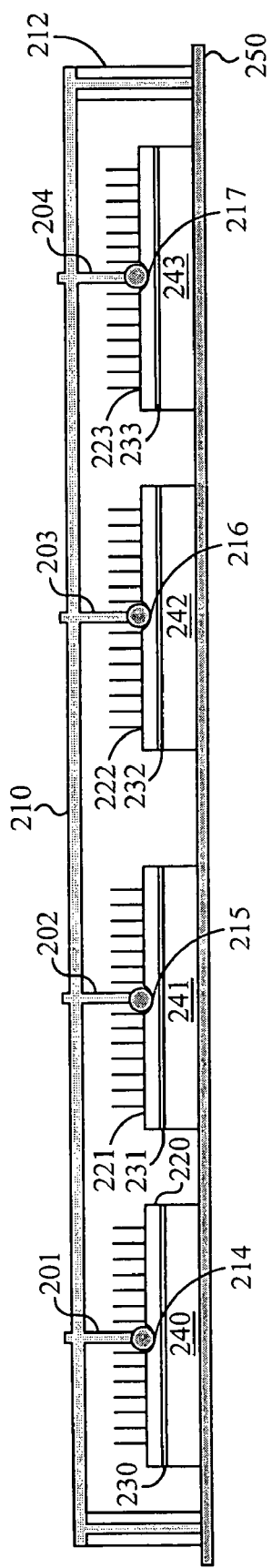
FIG. 3 illustrates a joining mechanism configured to couple four heat exchangers to four heat sources using a single joining mechanism.

The concept of multiple heat exchangers couples to multiple heat sources using a single joining mechanism can be applied to more than two heat exchanger/heat source pairs. FIG. 3 illustrates a joining mechanism configured to couple four heat exchangers to four heat sources using a single joining mechanism. The joining mechanism shown in FIG. 3 is configured similarly to and operates similarly to the joining mechanism of FIG. 2 except that the joining mechanism of FIG. 3 is configured with four gimbaling joints, which are used to coupled four heat exchangers to four corresponding heat sources. Each heat exchanger 220, 221, 222, 223 is coupled to a corresponding heat source 240, 241, 242, 243, via a force retention means, thereby forming a thermal interface 230, 231, 232, 233, respectively. Each of the heat sources 240, 241, 242, 243 are coupled to a circuit board 250. The joining mechanism includes a gimbal plate 210 and mounting stands 212 coupled to the circuit board 250. The retention force is imparted to the heat exchanger 220 via a post 201 and a gimbal joint 214, to the heat exchanger 221 via a post 202 and a gimbal joint 215, to the heat exchanger 222 via a post 203 and a gimbal joint 216, and to the heat exchanger 223 via a post 204 and a gimbal joint 217. The gimbal joints 214, 215, 216, 217 are coupled to a bottom surface of the gimbal plate 210. The gimbal joints 214, 215, 216, 217 are each configured similarly as the gimbal joint 14 (FIG. 1).

Although the posts shown in FIGS. 2 and 3 are the same length, the actual length of each post can be customized to meet the actual height of any specific application, including the configuration where the mating surface of one or more of the heat sources are positioned at different heights relative to the mounting surface. In this case, one or more of the posts are of varied length to match the varied heights of the heat sources.

FIGS. 4-11 illustrate exemplary embodiments of various heat exchanger configurations to be implemented with the joining mechanism described above. To provide a better surface to mate with the single-point contact of the joint, particularly with existing heat sinks or heat pipe assemblies, an adapter plate can be used. The adapter plate provides a smooth surface to receive the above mentioned retention mechanisms. The adapter plate can also have features to locate the adapter plate at the center of the heat sink or heat pipe assembly.

Figure 4A:
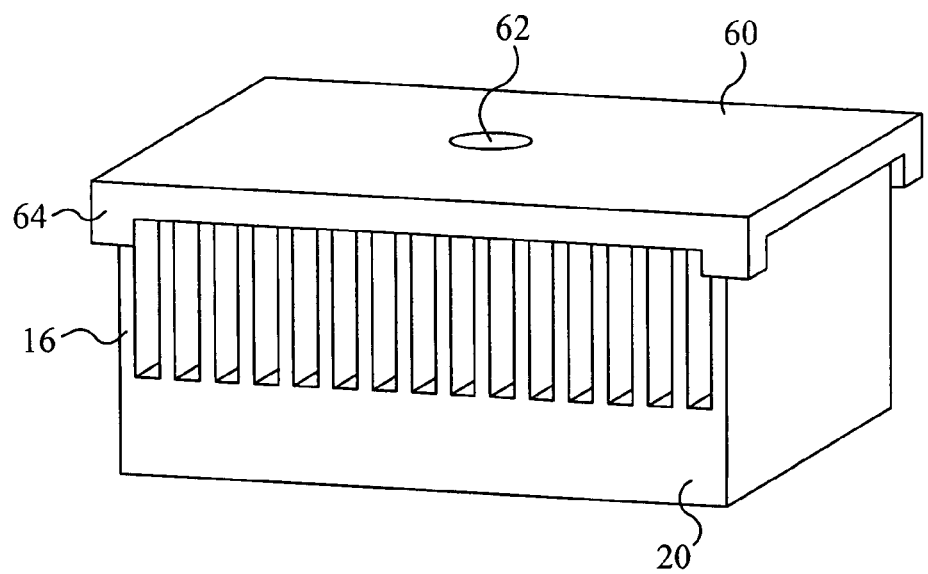
FIG. 4A illustrates a first exemplary heat exchanger configuration.
Figure 4B:
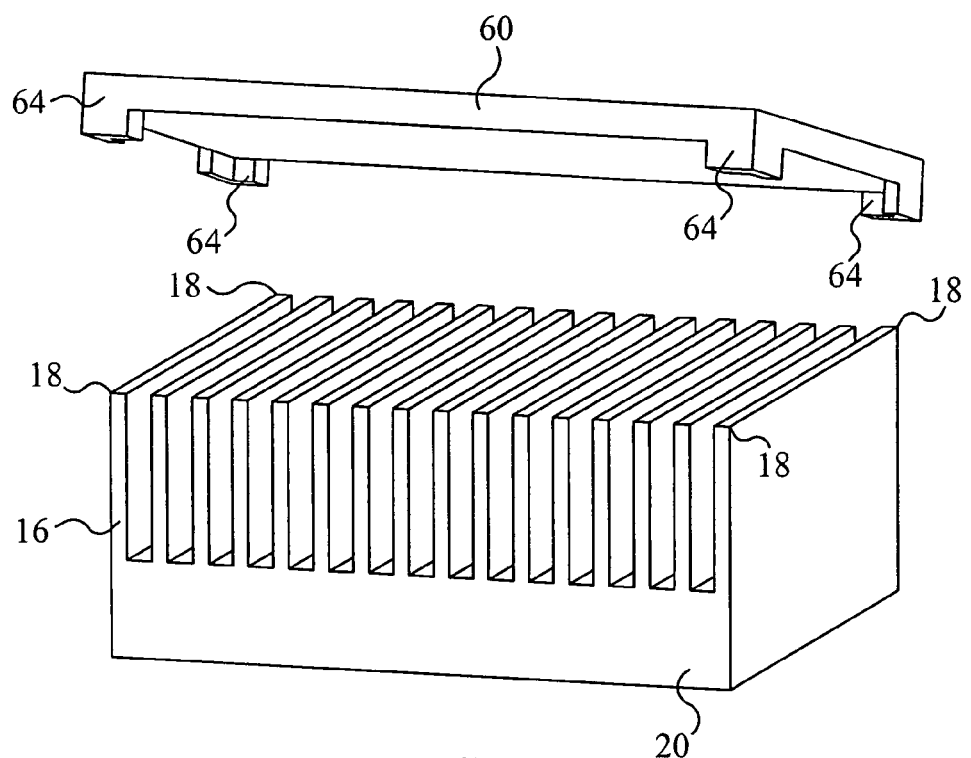
FIG. 4B illustrates an exploded view of the heat exchanger configuration of FIG. 4A.

FIG. 4A illustrates a first exemplary heat exchanger configuration including an adapter plate 60 coupled to a heat sink 20. FIG. 4B illustrates an exploded view of the heat exchanger configuration of FIG. 4A. The heat sink 20 includes a plurality of fins 16. The adapter plate 60 includes a receiver element 62 to mate with a single point contact of a gimbal joint. The adapter plate 60 is preferably configured such that the receiver element 62 is positioned in the center of the heat sink 20. The receiver 62 is a depression in the top surface of the adapter plate 60. A width of the depression is preferably larger than a width of the single point contact element. Alternatively, the receiver element 62 is a depression with a thru-hole at the bottom of the depression. In this alternative configuration, the width of the thru-hole is smaller than a width of the single point contact element of the gimbal joint. The sides of the depression surrounding the thru-hole can be concave or convex. The depression is compatible with a larger range of diameters of single point contact elements since the single point contact cannot slip through the thru-hole. The adapter plate 60 also includes locating features 64 to laterally secure the adapter plate 60 to the fins 16. As shown in FIGS. 4A and 4B, the adapter plate 60 includes four locating features, one on each corner. Each locating feature 64 is configured to mate with an end 18 on one of the end fins 16. The adapter plate 60 is configured to cover the entire top surface of the fins 16. In such a configuration, the adapter plate 60 provides an air duct past the fins 16, resulting in enhanced thermal performance of the heat sink 20.

Figure 5A:
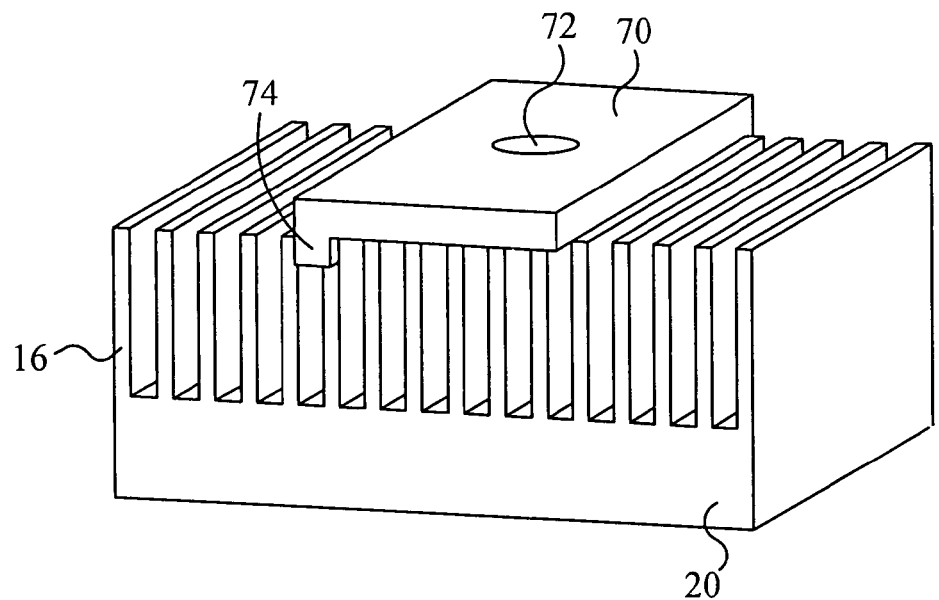
FIG. 5A illustrates a second exemplary heat exchanger configuration.
Figure 5B:
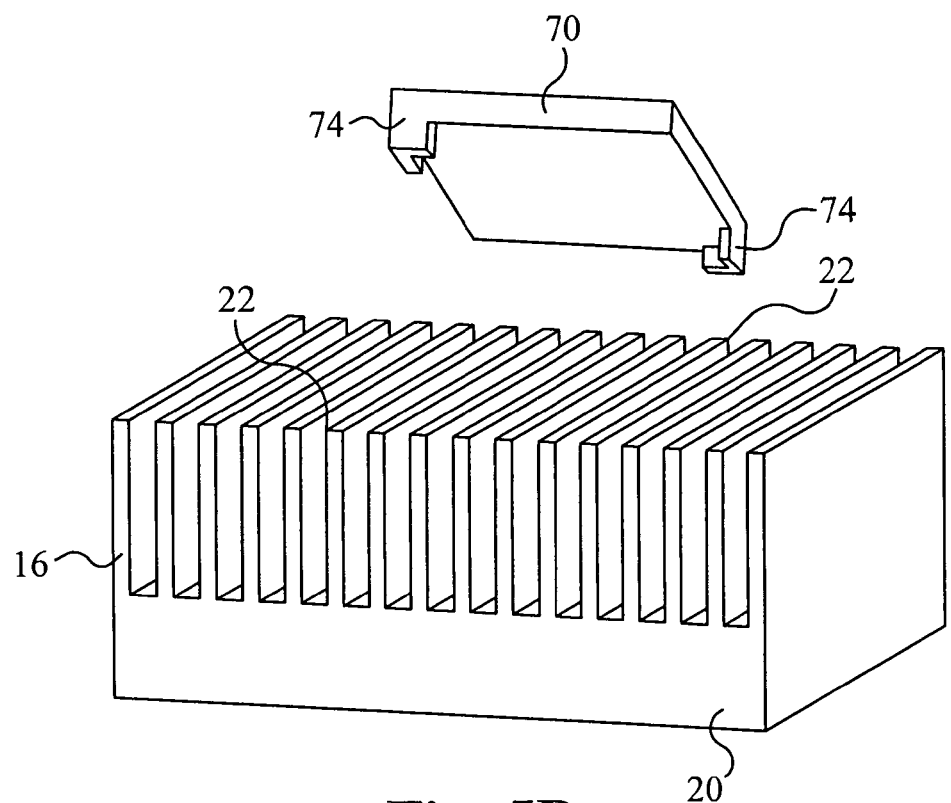
FIG. 5B illustrates an exploded view of the heat exchanger configuration of FIG. 5A.

FIG. 5A illustrates a second exemplary heat exchanger configuration including an adapter plate 70 coupled to the heat sink 20. FIG. 5B illustrates an exploded view of the heat exchanger configuration of FIG. 5A. The adapter plate 70 includes a receiver element 72 to mate with the single point contact element of the gimbal joint. The adapter plate 70 is preferably configured such that the receiver element 72 is positioned in the center of the heat sink 20. The receiver 72 is a depression in the top surface of the adapter plate 70. A width of the depression is preferably larger than a width of the single point contact element. Alternatively, the receiver element 72 is a depression with a thru-hole at the bottom of the depression. In this alternative configuration, the width of the thru-hole is smaller than a width of the single point contact element of the gimbal joint. The sides of the depression surrounding the thru-hole can be concave or convex. The adapter plate 70 also includes locating features 74 to laterally secure the adapter plate 70 to the fins 16. As shown in FIGS. 5A and 5B, the adapter plate 70 includes two locating features, positioned on opposing corners. Each locating feature 74 is configured to mate with an end 22 on one of the interior fins 16. The adapter plate 70 is configured to cover a portion of the top surface of the fins 16.

Figure 6A:
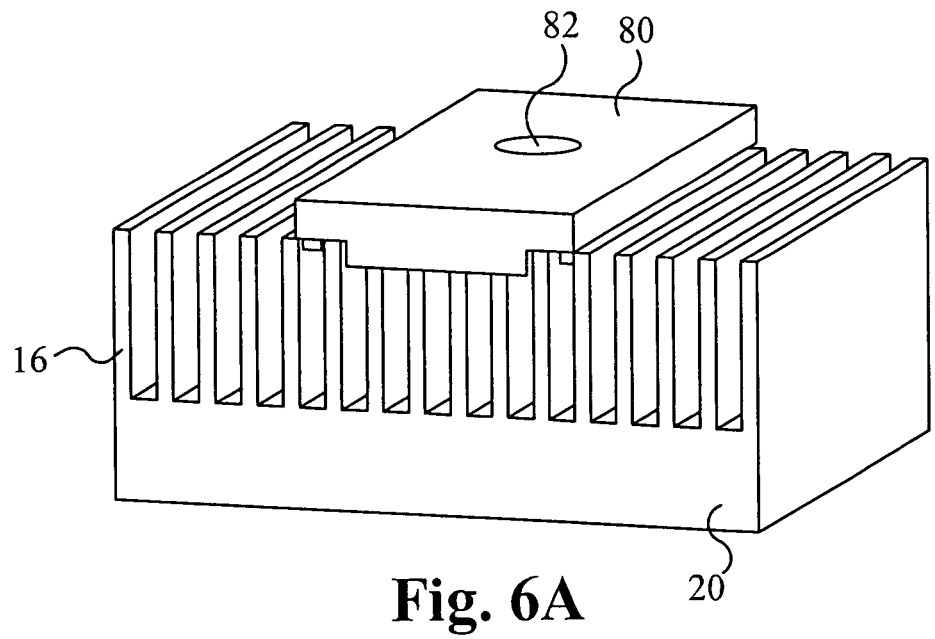
FIG. 6A illustrates a third exemplary heat exchanger configuration.
Figure 6B:
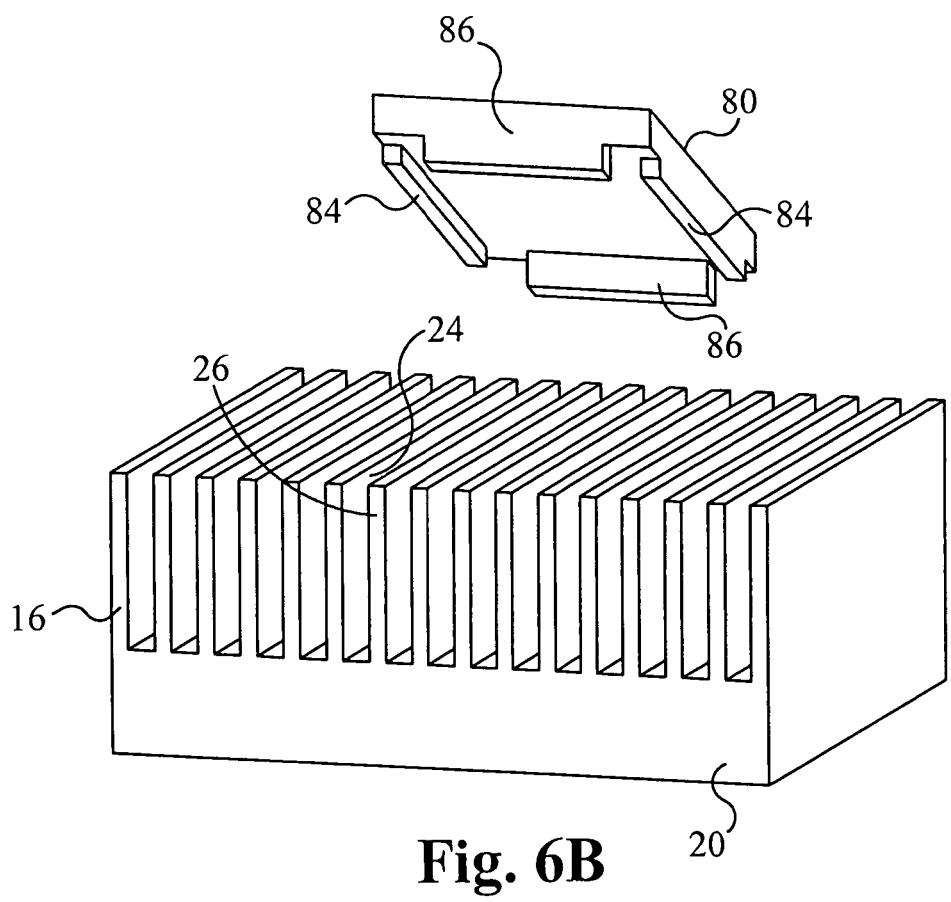
FIG. 6B illustrates an exploded view of the heat exchanger configuration of FIG. 6A.

FIG. 6A illustrates a third exemplary heat exchanger configuration including an adapter plate 80 coupled to the heat sink 20. FIG. 6B illustrates an exploded view of the heat exchanger configuration of FIG. 6A. The adapter plate 80 includes a receiver element 82 to mate with the single point contact of the gimbal joint. The adapter plate 80 is preferably configured such that the receiver element 82 is positioned in the center of the heat sink 20. The receiver 82 is a depression in the top surface of the adapter plate 80. A width of the depression is preferably larger than a width of the single point contact element. Alternatively, the receiver element 82 is a depression with a thru-hole at the bottom of the depression. In this alternative configuration, the width of the thru-hole is smaller than a width of the single point contact element of the gimbal joint. The sides of the depression surrounding the thru-hole can be concave or convex. The adapter plate 80 also includes a first pair of guide rails 84 and a second pair of guide rails 86 configured to laterally secure the adapter plate 80 to the fins 16. The guide rails 86 are configured to align with an outer face 26 of some or all of the fins 16. Each of the guide rails 84 is configured to align with a lengthwise face 24 of one of the fins 16. The adapter plate 80 is configured to cover a portion of the top surface of the fins 16.

It is understood that various combinations of the adapter plate features described above can be used. For example, the adapter plate 60 in FIGS. 4A and 4B can include two locating features, as used in the adapter plate 70 (FIGS. 5A and 5B), instead of the four locating features shown. Similarly, the adapter plate 70 in FIGS. 5A and 5B can include four locating features instead of the two locating features shown. As another example, the adapter plate 60 can be alternatively configured to replace the locating features 64 with guide rails similar to the guide rails 84 and 86 included on the adapter plate 80 (FIGS. 6A and 6B).

Figure 7A:
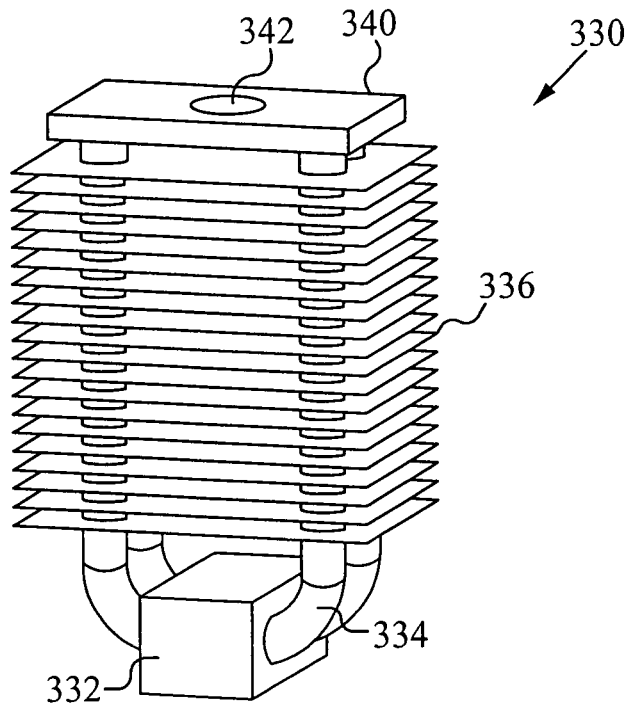
FIG. 7A illustrates a fourth exemplary heat exchanger configuration.
Figure 7B:
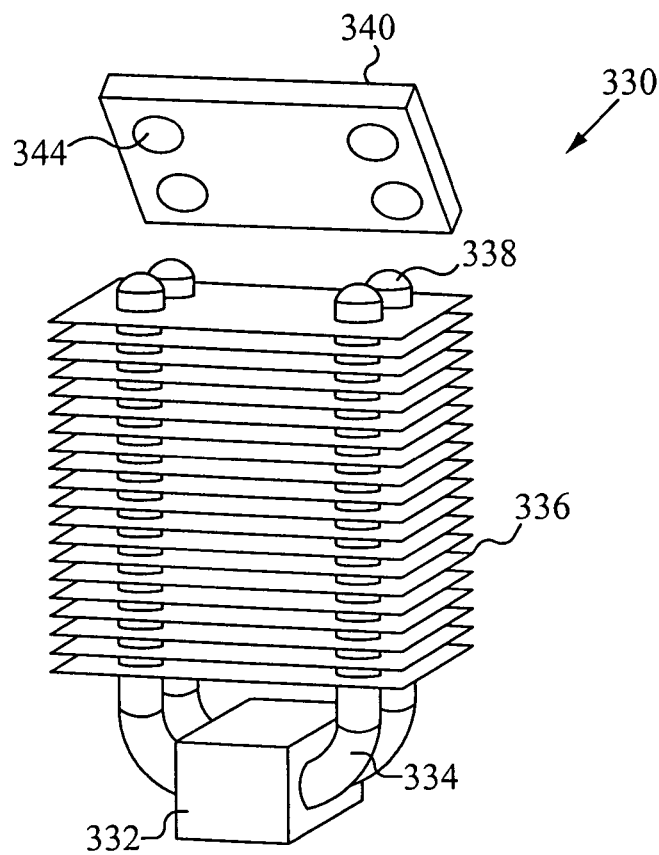
FIG. 7B illustrates a partially exploded view of the heat pipe assembly of FIG. 7A.

FIG. 7A illustrates a fourth exemplary heat exchanger configuration including a heat pipe assembly 330. The heat pipe assembly 330 includes a heat spreader 332, one or more heat pipes 334, a plurality of fins 336, and an adapter plate 340. FIG. 7B illustrates a partially exploded view of the heat pipe assembly 330 of FIG. 7A. A first end of each heat pipe 334 is coupled to the heat spreader 332. The fins 336 are coupled to the heat pipes 334. A second end 338 of each heat pipe 334 extends from the fins 336 and is coupled to a corresponding locating feature 344 on a bottom surface of the adapter plate 340. The locating features 344 which mate to the heat pipes 334 can be depressions, undersized holes that are less than the diameter of the heat pipe, or a combination of the two.

The adapter plate 340 includes a receiver element 342 to mate with a single point contact of a gimbal joint. The adapter plate 340 is preferably configured such that the receiver element 342 is positioned in the center of the heat spreader 332. The receiver 342 is a depression in the top surface of the adapter plate 340. A width of the depression is preferably larger than a width of the single point contact element. Alternatively, the receiver element 342 is a depression with a thru-hole at the bottom of the depression. In this alternative configuration, the width of the thru-hole is smaller than a width of the single point contact element of the gimbal joint. The sides of the depression surrounding the thru-hole can be concave or convex.

Figure 8A:
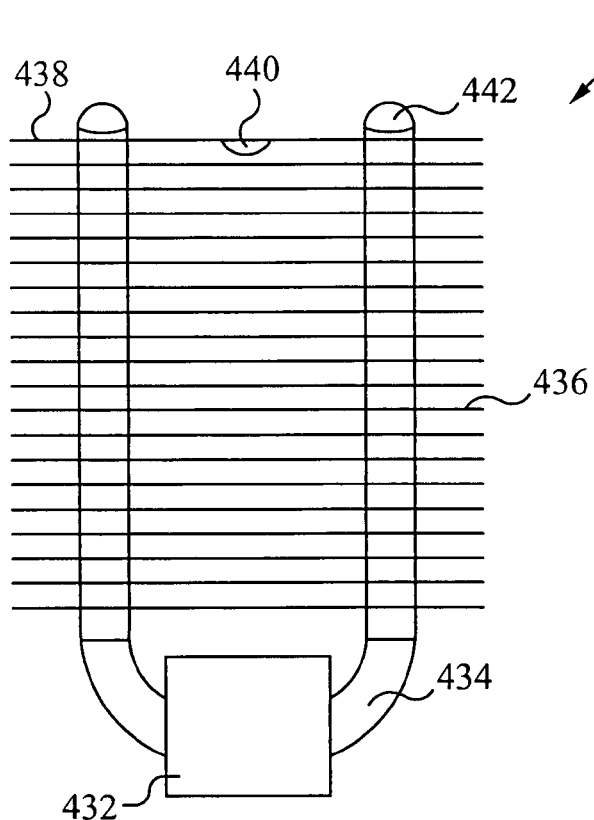
FIG. 8A illustrates a fifth exemplary heat exchanger configuration.
Figure 8B:
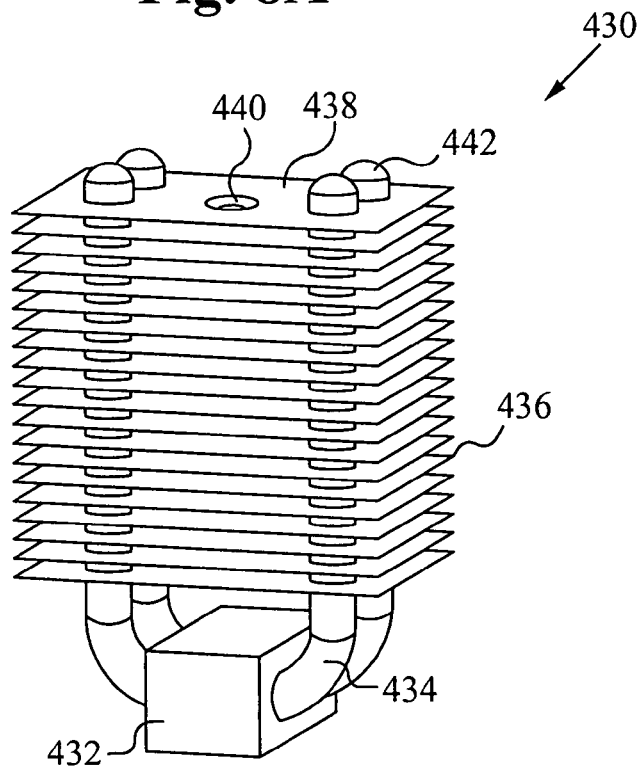
FIG. 8B illustrates a perspective view of the heat pipe assembly of FIG. 8A.

FIG. 8A illustrates a fifth exemplary heat exchanger configuration including a heat pipe assembly 430. The heat pipe assembly 430 includes a heat spreader 432, one or more heat pipes 434, and a plurality of fins 436. FIG. 8B illustrates a perspective view of the heat pipe assembly 430 of FIG. 8A. A first end of each heat pipe 434 is coupled to the heat spreader 432. The fins 436 are coupled to the heat pipes 436. A second end 442 of each heat pipe 434 extends from a top fin 438.

The top fin 438 includes a receiver element 440 to mate with a single point contact of a gimbal joint. The top fin 438 is preferably configured such that the receiver element 440 is positioned in the center of the heat spreader 432. The receiver 440 is a depression in the top fin 338. A width of the depression is preferably larger than a width of the single point contact element. Alternatively, the receiver element 440 is a depression with a thru-hole at the bottom of the depression. In this alternative configuration, the width of the thru-hole is smaller than a width of the single point contact element of the gimbal joint. The sides of the depression surrounding the thru-hole can be concave or convex. In some embodiments, the top fin 438 is thicker than the other fins 436 in order to withstand the retention force applied via the gimbal joint.

Figure 9:
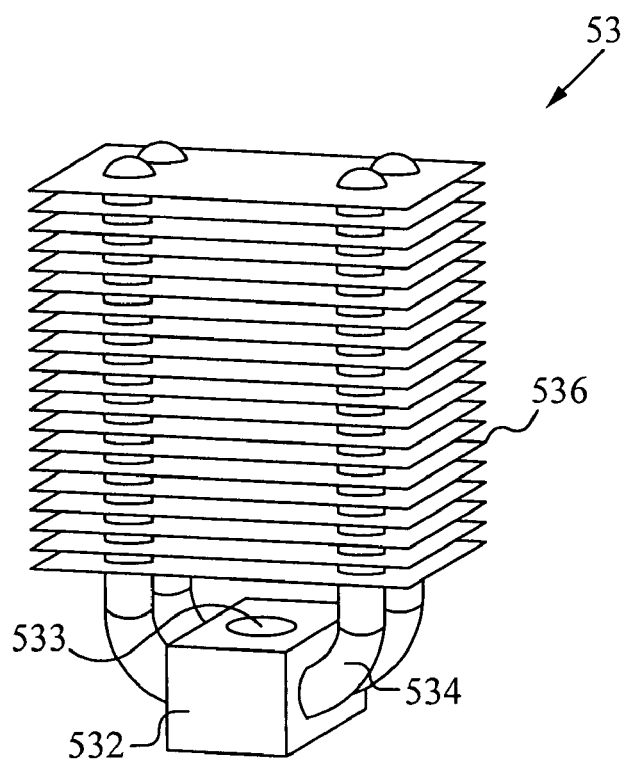
FIG. 9 illustrates a sixth exemplary heat exchanger configuration.

FIG. 9 illustrates a sixth exemplary heat exchanger configuration including a heat pipe assembly 530. The heat pipe assembly 530 includes a heat spreader 532, one or more heat pipes 534, and a plurality of fins 536. Each heat pipe 534 is coupled to the heat spreader 532. The fins 536 are coupled to the heat pipes 536.

The top surface of the heat spreader 532 includes a receiver element 533 to mate with a single point contact of a gimbal joint. The top surface of the heat spreader 532 is the surface opposite that of the thermal interface surface of the heat spreader 532. The top surface of the heat spreader 532 is preferably configured such that the receiver element 533 is positioned in the center of the heat spreader 532. The receiver element 533 is preferably a depression in the top surface of the heat spreader 532. A width of the depression is preferably larger than a width of the single point contact element.

Figure 10:
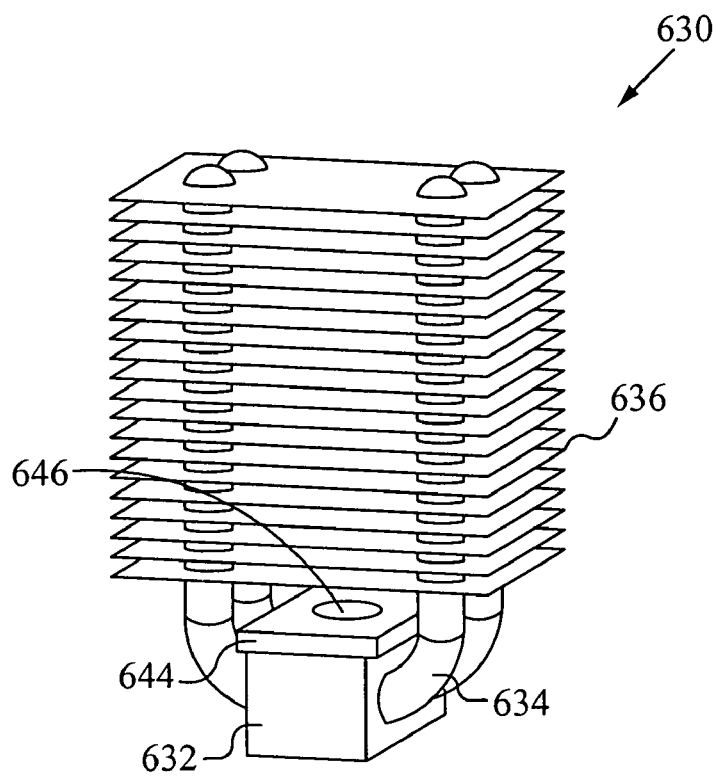
FIG. 10 illustrates a seventh exemplary heat exchanger configuration.

FIG. 10 illustrates a seventh exemplary heat exchanger configuration including a heat pipe assembly 630. The heat pipe assembly 630 includes a heat spreader 632, one or more heat pipes 634, a plurality of fins 636, and an adapter plate 644. Each heat pipe 634 is coupled to the heat spreader 632. The fins 636 are coupled to the heat pipes 536.

The adapter plate 644 includes a receiver element 646 to mate with a single point contact of a gimbal joint. The adapter plate 644 is preferably configured with locating features (not shown) that mate to corresponding locating features (not shown) on the top surface of the heat spreader 632 such that the receiver element 646 is positioned in the center of the heat spreader 632. Alternatively, the adapter plate 644 is permanently coupled to the heat spreader 632 such that the receiver element 646 is positioned in the center of the heat spreader 632.

Although four heat pipes are shown in FIGS. 7-10, the heat pipe assemblies described herein can include more or less than four heat pipes.

All configurations of adapter plate with a gimballing surface are contemplated with any combination of any locating feature including posts, flats, and edges and others not previously described herein. Additionally, although the gimballing joint is described above as including two mating elements, it is contemplated that the gimbal joint comprises a single component, the single point contact feature. In this case, the receiving element is not included. In those components where a receiving element is included, such as the adapter plates and top fins described above, a flat surface is instead contemplated.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

What is claimed is:

1. A joining system comprising:
   a. a plurality of heat generating devices mounted to a mounting apparatus;
   b. a plurality of heat exchangers, each heat exchanger coupled to a corresponding heat generating device; and
   c. a gimbal retention mechanism including a plurality of gimbal joints and one or more spring means, wherein the one or more spring means couple the gimbal retention mechanism to the mounting apparatus, and the plurality of gimbal joints couple the gimbal retention mechanism to the plurality of heat exchangers thereby coupling each heat exchanger to the corresponding heat generating device.

2. The joining system of claim 1 wherein the gimbal retention mechanism and each gimbal joint are configured such that each heat exchanger is independently planarized to the corresponding heat generating device.

3. The joining system of claim 1 wherein the plurality of heat exchangers are comprised of the group consisting of heat sinks, extruded fin heat sinks, crimped fin heat sinks, heat pipe assemblies, fluid-based heat exchangers, cold plates, injection molded heat sinks, forged heat sinks, vapor chambers, thermal siphons, or any combination of one or more thereof.

4. The joining system of claim 1 wherein each gimbal joint comprises a single-point contact element directed outward from the gimbal retention mechanism, and each heat exchanger includes a receiving point to mate to the single-point contact element.

5. The joining system of claim 4 wherein the gimbal retention mechanism further comprises a post coupled to the single-point contact element.

6. The joining system of claim 5 wherein a position of the post is configured to be adjusted.

7. The joining system of claim 4 wherein the single-point contact element is selected from a group consisting of a ball, a hemispherical surface, a point, and an ellipsoid.

8. The joining system of claim 4 wherein the receiving point comprises a depression in a mating surface of the heat exchanger.

9. The joining system of claim 4 wherein the receiving point comprises an opening in a mating surface of the heat exchanger, wherein a width of the opening is smaller than a width of the single-point contact element.

10. The joining system of claim 1 further comprising a plurality of adapter plates, each adapter plate is coupled to a corresponding heat exchanger, wherein each gimbal joint is coupled to the adapter plate of the corresponding heat exchanger.

11. The joining system of claim 10 wherein each gimbal joint comprises a single-point contact element directed outward from the gimbal retention mechanism, and each adapter plate includes a receiving point to mate to the single-point contact element.

12. The joining system of claim 11 wherein a position of the receiving point on each adapter plate coincides to a center position on a thermal contact surface of each corresponding heat exchanger with the corresponding heat generating device.

13. The joining system of claim 1 wherein each heat exchanger is coupled to the corresponding heat generating device via a thermal interface.

14. The joining system of claim 13 wherein the one or more spring means are configured to apply a retaining force, which is directed through each gimbal joint to the corresponding heat exchanger, thereby forcing each heat exchanger toward the corresponding heat generating device to form the thermal interface.

15. The joining system of claim 14 wherein the one or more spring means are configured to regulate the retaining force applied to each heat exchanger.

16. A joining system comprising:
   a. a heat generating device mounted to a mounting apparatus;
   b. a heat rejector coupled to the heat generating device, wherein the heat rejector includes a plurality of fins;
   c. an adapter plate coupled to a first end of one or more of the plurality of fins; and
   d. a gimbal retention mechanism including a gimbal joint and one or more spring means, wherein the gimbal joint is coupled to the adapter plate and the one or more spring means are coupled to the mounting apparatus, thereby coupling the heat rejector to the heat generating device.

17. The joining system of claim 16 wherein the heat rejector comprises a heat sink.

18. The joining system of claim 16 wherein the gimbal joint comprises a single-point contact element directed outward from the gimbal retention mechanism, and the adapter plate includes a receiving point to mate to the single-point contact element.

19. The joining system of claim 18 wherein a position of the receiving point on the adapter plate coincides to a center position on a thermal contact surface of the heat rejector with the heat generating device.

20. The joining system of claim 16 wherein the adapter plate includes two or more extensions, each extension is configured to mate with the first end of one of the plurality of fins thereby laterally stabilizing the adapter plate relative to the heat rejector.

21. The joining system of claim 16 the gimbal joint is configured such that the heat rejector self-planarizes to the heat generating device.

22. The joining system of claim 16 wherein the heat rejector is coupled to the heat generating device via a thermal interface.

23. The joining system of claim 22 wherein the one or more spring means are configured to apply a retaining force, which is directed through the gimbal joint to the heat rejector, thereby forcing the heat rejector toward the heat generating device to form the thermal interface.

24. The joining system of claim 23 wherein the one or more spring means are configured to regulate the retaining force applied to the heat rejector.

25. A joining system comprising:
   a. a heat generating device mounted to a mounting apparatus;
   b. a heat pipe assembly coupled to the heat generating device, wherein the heat pipe assembly includes one or more heat pipes, and a plurality of fins coupled to the one or more heat pipes; and
   c. a gimbal retention mechanism including a gimbal joint and one or more spring means, wherein the gimbal joint is coupled to the heat pipe assembly and the one or more spring means are coupled to the mounting apparatus, thereby coupling the heat pipe assembly to the heat generating device.

26. The joining system of claim 25 wherein the heat pipe assembly further comprises a heat spreader coupled to the one or more heat pipes, wherein the heat spreader is coupled to the heat generating device.

27. The joining system of claim 25 wherein the gimbal joint comprises a single-point contact element directed outward from the gimbal retention mechanism, and the heat rejector includes a receiving point to mate to the single-point contact element.

28. The joining system of claim 27 wherein a position of the receiving point on the heat pipe assembly coincides to a center position on a thermal contact surface of the heat pipe assembly with the heat generating device.

29. The joining system of claim 25 further comprising an adapter plate coupled to a first end of each of the one or more heat pipes, wherein the gimbal joint is coupled to the adapter plate.

30. The joining system of claim 29 wherein the gimbal joint comprises a single-point contact element directed outward from the gimbal retention mechanism, and the adapter plate includes a receiving point to mate to the single-point contact element.

31. The joining system of claim 30 wherein a position of the receiving point on the adapter plate coincides to a center position on a thermal contact surface of the heat pipe assembly with the heat generating device.

32. The joining system of claim 29 wherein the adapter plate includes one or more mating features, one mating feature for each one of the one or more heat pipes, and each mating feature is configured to mate with the first end of one of the one or more heat pipes thereby laterally stabilizing the adapter plate relative to the heat pipe assembly.

33. The joining system of claim 26 wherein the gimbal joint comprises a single-point contact element directed outward from the gimbal retention mechanism, and heat spreader includes a receiving point to mate to the single-point contact element.

34. The joining system of claim 33 wherein a position of the receiving point on the heat spreader coincides to a center position on a thermal contact surface of the heat spreader.

35. The joining system of claim 33 wherein the gimbal retention mechanism further comprises a post coupled to the single-point contact element.

36. The joining system of claim 35 wherein a position of the post is configured to be adjusted.

37. The joining system of claim 33 wherein the single-point contact element is selected from a group consisting of a ball, a hemispherical surface, a point, and an ellipsoid.

38. The joining system of claim 33 wherein the receiving point comprises a depression in a mating surface of the heat spreader.

39. The joining system of claim 33 wherein the receiving point comprises an opening in a mating surface of the heat spreader, wherein a width of the opening is smaller than a width of the single-point contact element.

40. The joining system of claim 26 further comprising an adapter plate coupled to the heat spreader, wherein the gimbal joint is coupled to the adapter plate.

41. The joining system of claim 40 wherein the gimbal joint comprises a single-point contact element directed outward from the gimbal retention mechanism, and the adapter plate includes a receiving point to mate to the single-point contact element.

42. The joining system of claim 41 wherein a position of the receiving point on the adapter plate coincides to a center position on a thermal contact surface of the heat spreader.

43. The joining system of claim 40 wherein the adapter plate includes one or more mating features configured to mate with the heat spreader thereby laterally stabilizing the adapter plate relative to the heat spreader.

44. The joining system of claim 26 the gimbal joint is configured such that the heat spreader self-planarizes to the heat generating device.

45. The joining system of claim 26 wherein the heat spreader is coupled to the heat generating device via a thermal interface.

46. The joining system of claim 45 wherein the one or more spring means are configured to apply a retaining force, which is directed through the gimbal joint to the heat spreader, thereby forcing the heat spreader toward the heat generating device to form the thermal interface.

47. The joining system of claim 46 wherein the one or more spring means are configured to regulate the retaining force applied to the heat spreader.

48. A joining system comprising:
   a. a heat generating device mounted to a mounting apparatus;
   b. a heat exchanger coupled to the heat generating device, wherein the heat exchanger includes a plurality of fins; and c. a gimbal retention mechanism including a gimbal joint and a plurality of mounting stands, each mounting stand includes a spring means, wherein the gimbal joint is coupled to the heat exchanger and each mounting stand is coupled to the mounting apparatus, thereby coupling the heat exchanger to the heat generating device.

49. The joining system of claim 48 wherein the gimbal joint comprises a single-point contact element directed outward from the gimbal retention mechanism, and the heat exchanger includes a receiving point to mate to the single-point contact element.

50. The joining system of claim 49 wherein the gimbal retention mechanism further comprises a post coupled to the single-point contact element.

51. The joining system of claim 50 wherein a position of the post is configured to be adjusted.

52. The joining system of claim 49 wherein the single-point contact element is selected from a group consisting of a ball, a hemispherical surface, a point, and an ellipsoid.

53. The joining system of claim 49 wherein the receiving point comprises a depression in a mating surface of the heat exchanger.

54. The joining system of claim 49 wherein the receiving point comprises an opening in a mating surface of the heat exchanger, wherein a width of the opening is smaller than a width of the single-point contact element.

55. The joining system of claim 48 further comprising an adapter plate coupled to a first end of one or more of the plurality of fins, wherein the gimbal joint is coupled to the adapter plate.

56. The joining system of claim 55 wherein the gimbal joint comprises a single-point contact element directed outward from the gimbal retention mechanism, and the adapter plate includes a receiving point to mate to the single-point contact element.

57. The joining system of claim 56 wherein a position of the receiving point on the adapter plate coincides to a center position on a thermal contact surface of the heat exchanger with the heat generating device.

58. The joining system of claim 55 wherein the adapter plate includes two or more extensions, each extension is configured to mate with the first end of one of the plurality of fins thereby laterally stabilizing the adapter plate relative to the heat exchanger.

59. The joining system of claim 48 the gimbal joint is configured such that the heat exchanger self-planarizes to the heat generating device.

60. The joining system of claim 48 wherein the heat exchanger is coupled to the heat generating device via a thermal interface.

61. The joining system of claim 60 wherein each spring means is configured to apply a retaining force, which is directed through the gimbal joint to the heat exchanger, thereby forcing the heat exchanger toward the heat generating device to form the thermal interface.

62. The joining system of claim 61 wherein each spring means is configured to regulate the retaining force applied to the heat exchanger.

* * * * *

UNITED STATES PATENT AND TRADEMARK OFFICE
CERTIFICATE OF CORRECTION

| | | |
|---|---|---|
| PATENT NO. | : 7,616,444 B2 | Page 1 of 1 |
| APPLICATION NO. | : 11/800101 | |
| DATED | : November 10, 2009 | |
| INVENTOR(S) | : Munch et al. | |

It is certified that error appears in the above-identified patent and that said Letters Patent is hereby corrected as shown below:

IN THE REFERENCES

In the References, on page 3, please insert reference U.S. Patent No. -- 6,210,986 -- after U.S. Patent No. 6,206,022 so that the reference correctly reads:

-- 6,210,986 B1  4/2001  Arnold et al................438/42 --

Signed and Sealed this

Twenty-second Day of December, 2009

David J. Kappos
*Director of the United States Patent and Trademark Office*